(12) United States Patent
Kawakubo et al.

(10) Patent No.: US 7,675,222 B2
(45) Date of Patent: Mar. 9, 2010

(54) THIN FILM PIEZOELECTRIC ACTUATOR

(75) Inventors: Takashi Kawakubo, Kanagawa-ken (JP); Ryoichi Ohara, Kanagawa-ken (JP); Tomio Ono, Kanagawa-ken (JP); Toshihiko Nagano, Kanagawa-ken (JP); Michihiko Nishigaki, Kanagawa-ken (JP); Takaaki Yasumoto, Kanagawa-ken (JP); Kazuhide Abe, Kanagawa-ken (JP); Kenya Sano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 11/781,667

(22) Filed: Jul. 23, 2007

(65) Prior Publication Data
US 2007/0278900 A1   Dec. 6, 2007

Related U.S. Application Data

(63) Continuation of application No. 11/054,404, filed on Feb. 10, 2005, now Pat. No. 7,459,833.

(30) Foreign Application Priority Data

Feb. 12, 2004 (JP) ............... 2004-034984
Jan. 11, 2005 (JP) ............... 2005-003370

(51) Int. Cl.
*H01L 41/08* (2006.01)
(52) U.S. Cl. .................................. 310/328
(58) Field of Classification Search ................ 310/365, 310/328, 311, 339, 309, 366, 359, 367, 368; 301/367, 368; 331/107 A; *H01L 41/08*
See application file for complete search history.

(56) References Cited

U.S. PATENT DOCUMENTS

| 6,809,604 | B2 * | 10/2004 | Kawakubo et al. | 331/158 |
| 7,233,094 | B2 * | 6/2007 | Akiyama et al. | 310/311 |
| 2003/0155845 | A1 * | 8/2003 | Uchiyama et al. | 310/367 |
| 2004/0207296 | A1 * | 10/2004 | Namerikawa et al. | 310/367 |

FOREIGN PATENT DOCUMENTS

| JP | 11-133850 | 5/1999 |
| JP | 2000-349357 | 12/2000 |

* cited by examiner

*Primary Examiner*—Quyen Leung
*Assistant Examiner*—Karen B Addison
(74) *Attorney, Agent, or Firm*—Oblon, Spivak, McClelland, Maier & Neustadt, P.C.

(57) ABSTRACT

A thin film piezoelectric actuator comprises a driving part at least one end of which is supported by an anchor portion. The driving part includes: a piezoelectric film, a first lower electrode provided under a first region of the piezoelectric film, a second lower electrode provided under a second region different from the first region of the piezoelectric film, a first upper electrode provided opposite to the first lower electrode on the piezoelectric film, a second upper electrode provided opposite to the second lower electrode on the piezoelectric film, a first connection part that electrically connects the first lower electrode and the second upper electrode via a first via hole formed in the piezoelectric film, and a second connection part that electrically connects the second lower electrode and the first upper electrode via a second via hole formed in the piezoelectric film.

10 Claims, 26 Drawing Sheets

THIN FILM PIEZOELECTRIC ACTUATOR

CROSS-REFERENCE TO RELATED APPLICATIONS

This application is a continuation application of and claims benefit of priority under 35 USC §120 from U.S. Ser. No. 11/054,404. filed Feb. 10, 2005, and claims the benefit of priority under 35 USC §119 from the prior Japanese Patent Application Nos. 2004-34984 and 2005-3370, filed on Feb. 12, 2004 and Jan. 11, 2005; the entire contents of which are incorporated herein by reference.

BACKGROUND OF THE INVENTION

The present invention relates to a thin film piezoelectric actuator and more particularly to a thin film piezoelectric actuator which can be favorably applied to a micro-electromechanical system (MEMS), can be easily controlled, and uses a piezoelectric thin film driven at a low voltage over a wide range.

In a microswitch or a variable capacitor by a conventional MEMS art, electrostatic force is mainly used as driving force. The MEMS actuator using the electrostatic force has an advantage that a very simple operation mechanism only applying a driving voltage to a pair of electrodes across a space is preferably used (for example, "Smart Structure and Materials 2002: Smart Electronics, MEMS and Nanotechnology", V. K. Varadan, Editor, Proceedings of SPIE Vol. 4700 (2002), pp. 40-49).

On the other hand, from the nature that electrostatic force is inversely proportional to the square of a distance, when the spacing is up to about ⅔ of the initial spacing where the relation of the applied voltage and the movement distance of electrons is non-linear, a phenomenon called "pull-in" that the spacing is discontinuously closed is generated. Therefore, the driving range is narrow and to drive at a distance of longer than 1 μm, a driving voltage of higher than 20 V is generally necessary. At present, from the problem that the driving voltage is high, it is not easily applied to general consumer appliances.

In the conventional piezoelectric actuator, as piezoelectric ceramics, a PZT series (lead zirconate titanate) material having a very high piezoelectric property can be used, so that piezoelectric actuators in various shapes can be produced. However, to produce a highly efficient piezoelectric thin film of PZT series by the thin film art, problem arise that in a lead series material, the melting point thereof is low and the vapor pressure thereof is high, and the composition control in the film deposition process is difficult, and the lead series material cannot be used in a general semiconductor manufacturing line.

Therefore, the inventors of the present invention variously examined piezoelectric thin films which can be produced by the thin film deposition method and found that a film of aluminum nitride (AlN) or zinc oxide (ZnO) orientated in the c-axis having a wurtzite crystal structure is suitable. However, AlN and ZnO, compared with the aforementioned PZT family, have very low piezoelectric properties such as less than ⅒. Therefore, when preparing a piezoelectric actuator structure, to increase the displacement amount, it is necessary to thin and lengthen the actuator, that is, increase the aspect ratio. When a thin film having a structure of such a high aspect ratio is prepared, the cantilever beam structure often used in a piezoelectric actuator using piezoelectric ceramics is unstable structurally. Therefore, a double-clamped beam structure is more suitable.

FIG. 42 is a schematic view showing the sectional structure of a thin film piezoelectric actuator having the double-clamped beam structure examined by the inventors in the process of the present invention. The actuator includes a driving part 605 composed of a piezoelectric body 604 which is in contact with anchors 601 on both sides and is held by two sets of upper and lower electrodes 602 and 603 and a support film 606 forming a bimorph structure. In this concrete example, the device is applied to a capacitive microswitch and at a central part 607 held by the two driving parts 606, switching electrode contacts 608 and 609 are provided.

The operation of the thin film piezoelectric actuator having a double-clamped beam structure is displayed in FIG. 43. The actuator applies a driving voltage to the two driving parts 605 prepared on both sides in the same direction, deforms them in a convex shape, and drive them. At this time, the central part 607 is inversely deformed in a concave shape and the switching electrode makes contact with it to set a switch ON state. At this time, in order to deform the central part 607, an excessive driving voltage is needed to be applied (first problem).

When the thin film piezoelectric actuator having the double-clamped beam structure is applied to a variable capacitor, at the central part 607, a first electrode of the variable capacitor and a second electrode opposite to it are provided. Also in a case of the variable capacitor, similarly to the capacitive microswitch, the thin film piezoelectric actuator is operated as shown in FIG. 43 and changes the spacing between the capacitor electrodes and changes the capacity. However, in a case of the variable capacitor, the central part is bent, so that it is difficult to vertically move the substrate and flat electrodes in a state that they are kept parallel with each other (second problem).

As explained above, in the conventional MEMS actuator, a problem arises that in the applied device, the driving voltage is high and the operation is not linear, and in the device designed to solve the problem, another structural problem is imposed.

SUMMARY OF THE INVENTION

According to an aspect of the invention, there is provided a thin film piezoelectric actuator comprising a driving part at least one end of which is supported by an anchor portion, the driving part including: a piezoelectric film, a first lower electrode provided under a first region of the piezoelectric film, a second lower electrode provided under a second region different from the first region of the piezoelectric film, a first upper electrode provided opposite to the first lower electrode on the piezoelectric film, a second upper electrode provided opposite to the second lower electrode on the piezoelectric film, a first connection part that electrically connects the first lower electrode and the second upper electrode via a first via hole formed in the piezoelectric film, and a second connection part that electrically connects the second lower electrode and the first upper electrode via a second via hole formed in the piezoelectric film.

According to other aspect of the invention, there is provided a thin film piezoelectric actuator comprising a driving part at least one end of which is supported by an anchor portion, the driving part including: a first piezoelectric film, a first lower electrode provided under the first piezoelectric film, a second lower electrode provided under the first piezoelectric film, a first intermediate electrode provided opposite to the first lower electrode above the first piezoelectric film, a second intermediate electrode provided opposite to the second lower electrode above the first piezoelectric film, a second piezoelectric film provided above the first and second intermediate electrodes, a first upper electrode provided opposite to the first intermediate electrode above the second piezoelectric film, a second upper electrode provided opposite to the second intermediate electrode above the second piezoelectric film, a first connection part for electrically connecting the first lower electrode and the second intermediate electrode via a first via hole formed in the first piezoelectric film, a second connection part for electrically connecting the second lower electrode and the first intermediate electrode via a second via hole formed in the first piezoelectric film, a third connection part for electrically connecting the second intermediate electrode and the first upper electrode via a third via hole formed in the second piezoelectric film, and a fourth connection part for electrically connecting the first intermediate electrode and the second intermediate electrode via a fourth via hole formed in the second piezoelectric film.

According to other aspect of the invention, there is provided a thin film piezoelectric actuator comprising a driving part at least one end of which is supported by an anchor portion, the driving part including: a lower electrode, a piezoelectric film which is laminated on the lower electrode and extends beyond any of end faces of the lower electrode, and an upper electrode provided on at least one part of the piezoelectric film, the piezoelectric film being made of aluminum nitride (AlN) or zinc oxide (ZnO) which is orientated in a c-axis and the one end face of the electrode being formed in a tapered shape at up to 60° with a main surface of the lower electrode.

BRIEF DESCRIPTION OF THE DRAWINGS

The present invention will be understood more fully from the detailed description given here below and from the accompanying drawings of the examples of the invention. However, the drawings are not intended to imply limitation of the invention to a specific example, but are for explanation and understanding only.

In the drawings.

DETAILED DESCRIPTION

As a result of further examination, the inventors of the present invention found that the first and the second problems can be solved by adopting a structure where the piezoelectric actuators of two or more which have reversed polarities with respect to each other are provided.

Figure 44:
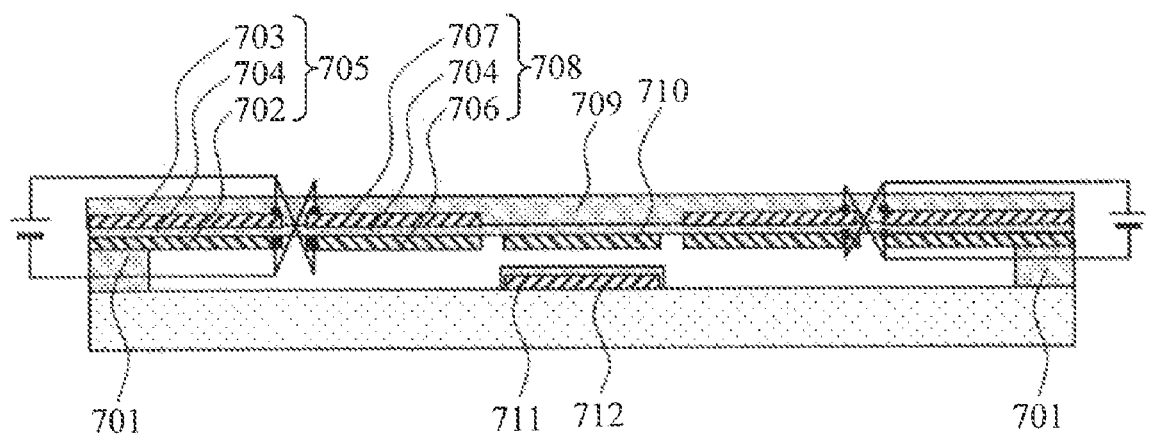
FIG. 44 is a drawing showing a variable capacitor applying the thin film piezoelectric actuator which is examined by the inventors of the present invention in the course of attaining this invention.

FIG. 44 is a drawing showing a variable capacitor applying the thin film piezoelectric actuator which is examined by the inventors of the present invention in the course of attaining this invention.

In this actuator, a first driving part 705 in contact with anchors 701 on both sides, which is composed of first upper and lower electrodes 702 and 703 and a piezoelectric film 704 held by them, a second driving part 708 provided in the neighborhood of the first driving part 705, which is composed of second upper and lower electrodes 706 and 707 and the piezoelectric film 704 held by them, and a support film 709 for forming a bimorph structure are provided. The first upper electrode 703 and the second lower electrode 706 are connected. And, the first lower electrode 702 and the second upper electrode 707 are connected. With respect to the first and second driving parts 705 and 708, two sets are respectively provided symmetrically horizontally. A first electrode 710 of the variable capacitor is provided at the central part of the actuator, and an opposite second electrode 712 of the variable capacitor covered with a dielectric film 711 is provided at the central part of the substrate.

Figure 45:
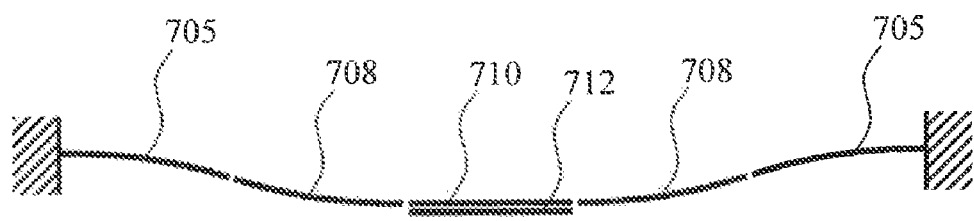
FIG. 45 is a drawing showing the operation status of the thin film piezoelectric actuator shown in FIG. 44.

FIG. 45 is a drawing showing the operation status of the thin film piezoelectric actuator. When a driving voltage is applied, the first driving part 705 and the second driving part 708 are inversely deformed each other. In the example shown in FIG. 45, the first driving part 705 is deformed convexly upward and the second driving part 708 is deformed convexly downward. And if their lengths are the same, their inclinations in the face direction are mutually canceled and an excessive load is not applied to the actuator. Further, the first electrode 710 of the variable capacitor at the central part of the actuator always can move vertically in parallel and the capacity between the electrodes 710 and 712 can be changed continuously within the widest range from the separate state to the contact state with the overall face.

Although the thin film piezoelectric actuator shown in FIG. 44 may exhibit an ideal operation status, it has a new problem. The new problem is how to connect the first upper electrode 703 and the second lower electrode 706, and the first lower electrode 707 and the second upper electrode 702. In a case of a piezoelectric actuator using a bulk material, outside lines are easily connected by a solder. But in the case of the thin film piezoelectric actuator, outside lines can not be used. Further, it is undesirable that the thin film piezoelectric actuator is twisted excessively due to the connected outside lines. And, it is also undesirable that the mechanical strength of the thin film piezoelectric actuator is weakened remarkably due to the connected outside lines.

The inventors of the present invention have examined above problems in the course of attaining this invention. Namely, in the thin film piezoelectric actuator of the invention, via holes of two or more are formed side by side perpendicularly to the driving shaft of the actuator in the piezoelectric film, and in each area of the via holes, the first lower electrode and the second upper electrode are overlapped and connected, and the second lower electrode and the first upper electrode are overlapped and connected.

Hereinafter, the embodiments of the present invention will be explained with reference to the accompanying drawings.

First Embodiment

Figure 1:
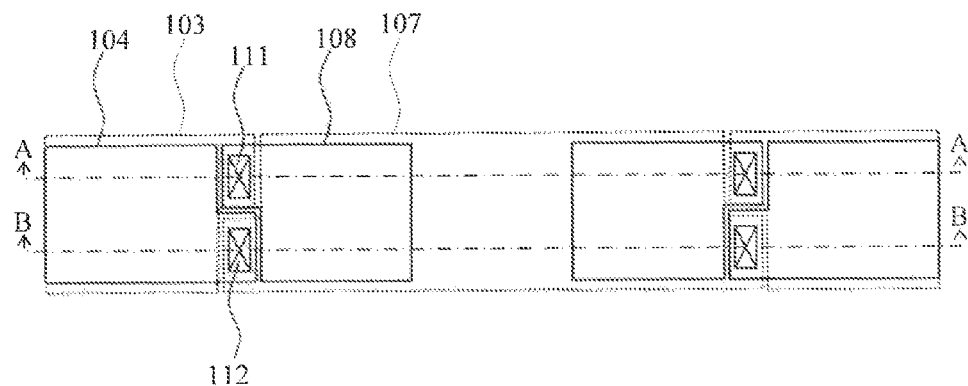
FIG. 1 is a top view of a variable capacitor using the thin film piezoelectric actuator of the first example of the present invention.
Figure 2:
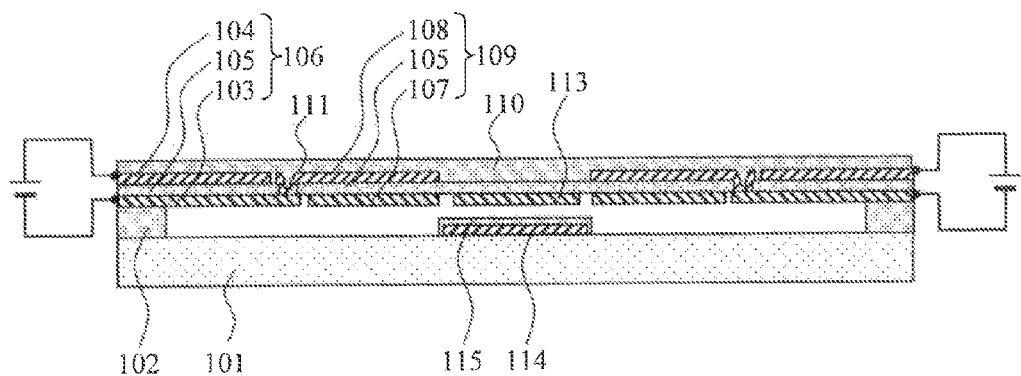
FIG. 2 is a cross sectional view of the variable capacitor using the thin film piezoelectric actuator of the first example of the present invention (the section A-A shown in FIG. 1)
Figure 3:
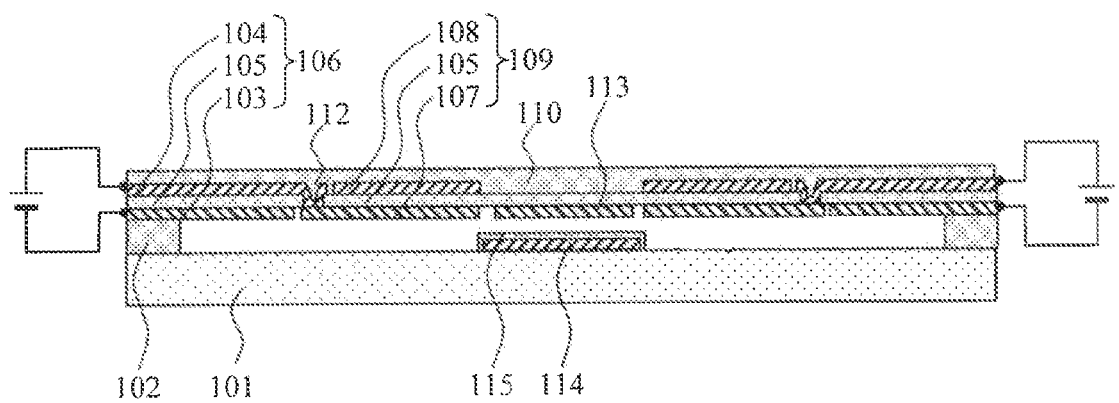
FIG. 3 is a cross sectional view of the variable capacitor using the thin film piezoelectric actuator of the first example of the present invention (the section B-B shown in FIG. 1)

FIG. 1 is a plan view of a variable capacitor applying the thin film piezoelectric actuator of a double-clamped beam structure of the first example of the present invention. Further, FIG. 2 is a cross sectional view of the line A-A of the plan view shown in FIG. 1, and FIG. 3 is a cross sectional view of the line B-B. In the plan view shown in FIG. 1, to avoid complication, only the upper and lower electrodes and via holes are shown.

As shown in FIGS. 2 and 3, a first driving part 106 in contact with anchors 102 on both sides provided on a substrate 101, which is composed of first upper and lower electrodes 103 and 104 and a first piezoelectric film 105 held by them, a second driving part 109 provided in the neighborhood of the first driving part 106, which is composed of second upper and lower electrodes 107 and 108 and the piezoelectric film 105 held by them, and a support film 110 for forming a bimorph structure are provided. The support film 110 may be provided under the electrodes 103 and 107 instead of above the electrodes 104 and 108. With respect to the first and second driving parts 106 and 109, two sets are respectively provided symmetrically along the driving shaft of the center beam.

In the piezoelectric film 105, between the first driving part 106 and the second driving part 109, a first via hole 111 and a second via hole 112 are formed side by side perpendicularly to the driving shaft, and the first lower electrode 103 and the second upper electrode 108 are connected through the first via hole 111, and the second lower electrode 107 and the first upper electrode 104 are connected through the second via hole 112.

Further, at the central part of the actuator, a first electrode 113 of the variable capacitor is formed and on the opposite substrate 101, a second electrode 114 of the variable capacitor and a dielectric film 115 for preventing a short circuit between the electrodes are formed.

The first and second upper and lower electrodes 103, 104, 107, and 108 of the actuator are made of Al and the thickness thereof in consideration of the resistance, can be set to, for example, about 10 nm to 1 µm, though in this example, they are all set to 50 nm. Further, the piezoelectric film 105 of the actuator is made of AlN orientated in the c-axis, and the thickness, in consideration of the displacement amount, can be set to, for example, about 10 nm to 1 µm, though in this example, they are all set to 500 nm. The support film 110 is made of an SiO$_2$ film and the thickness is set to 500 nm. The equivalent area of the variable capacitor is set to 6400 µm2, and the dielectric film 115 is made of AlN, and the thickness is set to 10 nm.

According to this example, by connection through the via holes, the structures of the piezoelectric film and electrode and the connection part can be patterned at the same time, so that excessive processing steps for connection are not required. Further, in each driving part, the driving area in which the upper and lower electrodes are opposite to each other across the piezoelectric film can be formed symmetrically vertically and horizontally with respect to the driving shaft such as a rectangle, so that it is not twisted. The thin film piezoelectric actuator of the present invention has a stable structure, a good control property, and a wide movement range.

And, the thin film piezoelectric actuator of the present invention, as described in FIG. 45, performs an ideal operation over a wide range. Namely, when a driving voltage is applied, the first driving part 106 and the second driving part 109 are deformed inversely. For example, when the first driving part 106 is deformed convexly upward, the second driving part 109 is deformed convexly downward, and when their lengths are the same, their inclinations in the face direction are mutually canceled, and an excessive load is not applied to the actuator. Further, the first electrode 113 of the variable capacitor at the central part of the actuator always can move vertically in parallel and the capacity between the electrodes 113 and 114 can be changed continuously within the widest range from the separate state to the contact state with the overall face.

When a control voltage ($V_{tune}$) of 0 to 3 V is applied to the variable capacitor to which the thin film piezoelectric actuator is applied and the capacitor capacity between the first and second electrodes of the variable capacitor is measured, a very large variable width from a minimum of 0.34 pF to a maximum of 5.1 pF, that is, 15 times can be obtained continuously.

Figure 4:
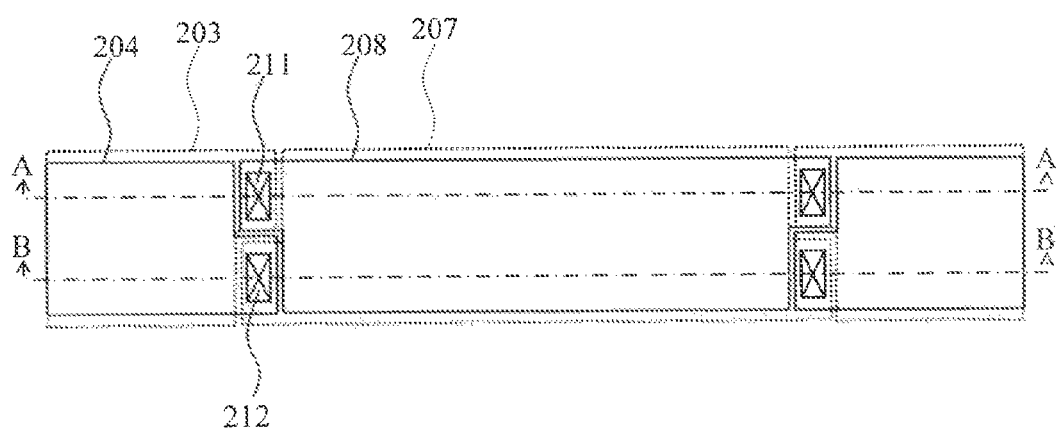
FIG. 4 is a top view of a capacitive microswitch using the thin film piezoelectric actuator of the first example of the present invention.

FIG. 4 shows a plan view of a capacitive microswitch to which the thin film piezoelectric actuator of a double-clamped beam structure of the first example of the present invention. The section A-A of the plan view shown in FIG. 4 and the section B-B thereof are shown respectively in FIGS. 5 and 6. Further, in the plan view shown in FIG. 4, to avoid complication, only the upper and lower electrodes and via holes are shown.

Figure 5:
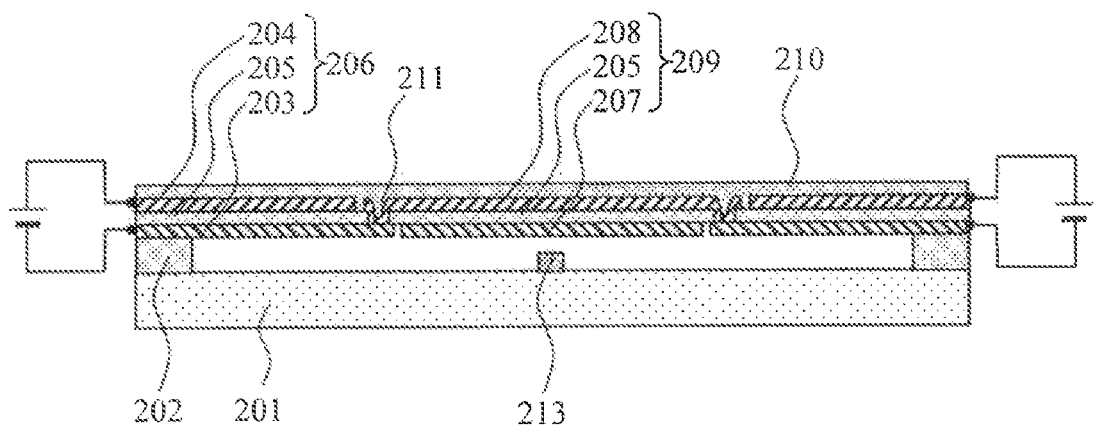
FIG. 5 is a cross sectional view of the capacitive microswitch using the thin film piezoelectric actuator of the first example of the present invention (the section A-A shown in FIG. 4)
Figure 6:
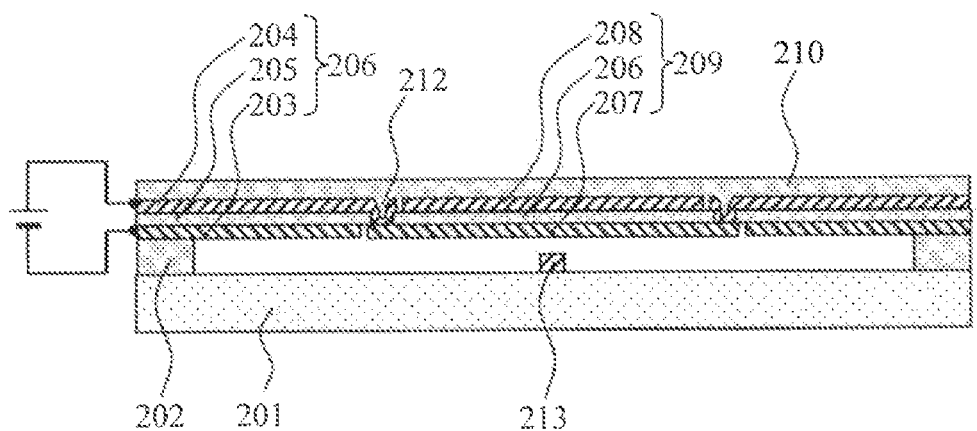
FIG. 6 is a cross sectional view of the capacitive microswitch using the thin film piezoelectric actuator of the first example of the present invention (the section B-B shown in FIG. 4)

As shown in FIGS. 5 and 6, two sets of first driving parts 206 in contact with anchors 202 on both sides provided on a substrate 201, which are composed of first upper and lower electrodes 203 and 204 and a piezoelectric film 205 held by them, are provided and at the central part, a second driving part 209 composed of second upper and lower electrodes 207 and 208 and the piezoelectric film 205 held by them is provided. On the upper part of the actuator, a support film 210 for forming a bimorph structure is provided.

In the piezoelectric film 205, between the first driving part 206 and the second driving part 209, a first via hole 211 and a second via hole 212 are formed side by side perpendicularly to the driving shaft, and the first lower electrode 203 and the second upper electrode 208 are connected through the first via hole 211, and the second lower electrode 207 and the first upper electrode 204 are connected through the second via hole 212.

Further, the second lower electrode 207 of the second driving part 209 serves as a switching electrode and on the opposite substrate 201, a switching electrode contact 213 for making ohmic contact is provided.

The first and second upper and lower electrodes 203, 204, 207, and 208 of the actuator are made of aluminum and the thickness thereof, in consideration of the resistance, can be set to, for example, about 10 nm to 1 µm, though in this example, they are all set to 50 nm. Further, the piezoelectric film 205 of the actuator is made of AlN orientated in the c-axis, and the thickness, in consideration of the displacement amount, can be set to, for example, about 10 nm to 1 µm, though in this example, they are all set to 500 nm. The support film 210 is made of a SiO$_2$ film and the thickness is set to 500 nm. The switching electrode contact 213 is made of Au.

When a control voltage ($V_{tune}$) of 0 V or 3 V is applied to the capacitive microswitch to which the thin film piezoelectric actuator is applied and the transmission characteristics at 2 GHz between the second lower electrode 207 and the switching electrode contact 213 are measured, very excellent switching characteristics such as an isolation of −38 dB at the time of switch off and an insertion loss of −0.14 dB at the time of switch on can be obtained.

Figure 7:
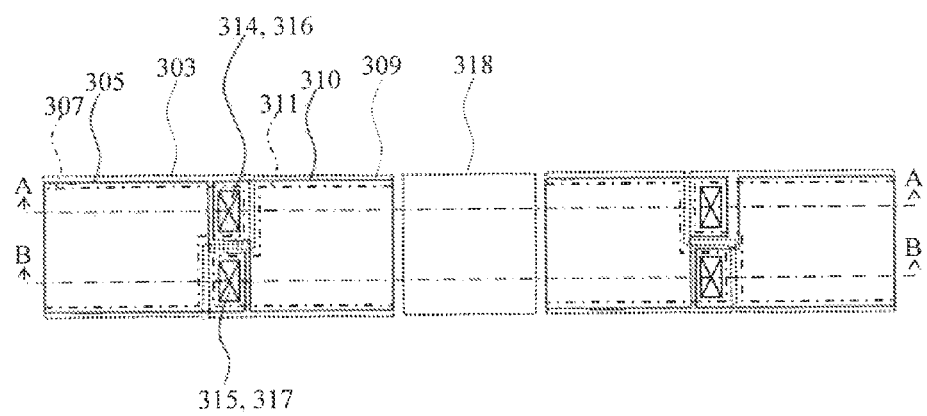
FIG. 7 is a top view of a variable capacitor using the thin film piezoelectric actuator of the second example of the present invention.

FIG. 7 shows a plan view of a variable capacitor to which the thin film piezoelectric actuator of a double-clamped beam structure of the second example of the present invention is applied. The section A-A of the plan view shown in FIG. 7 and the section B-B thereof are shown respectively in FIGS. 8 and 9. Further, in the plan view shown in FIG. 7, to avoid complication, only the upper and lower electrodes and via holes are shown.

Figure 8:
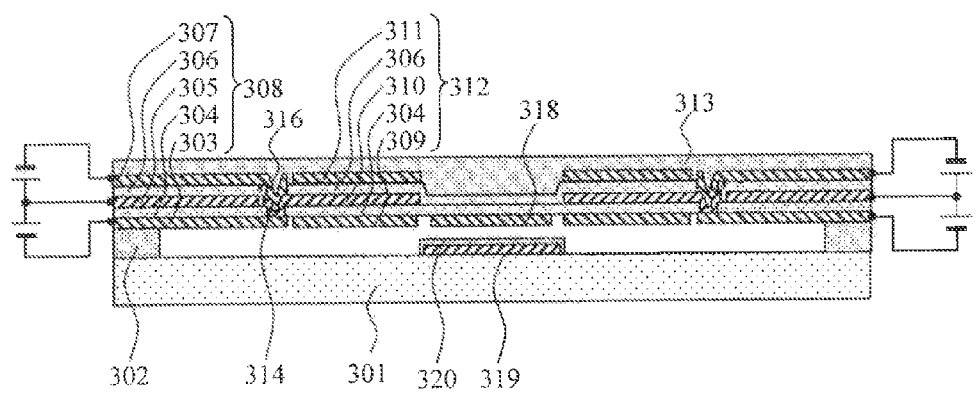
FIG. 8 is a cross sectional view of the variable capacitor using the thin film piezoelectric actuator of the second example of the present invention (the section A-A shown in FIG. 7)
Figure 9:
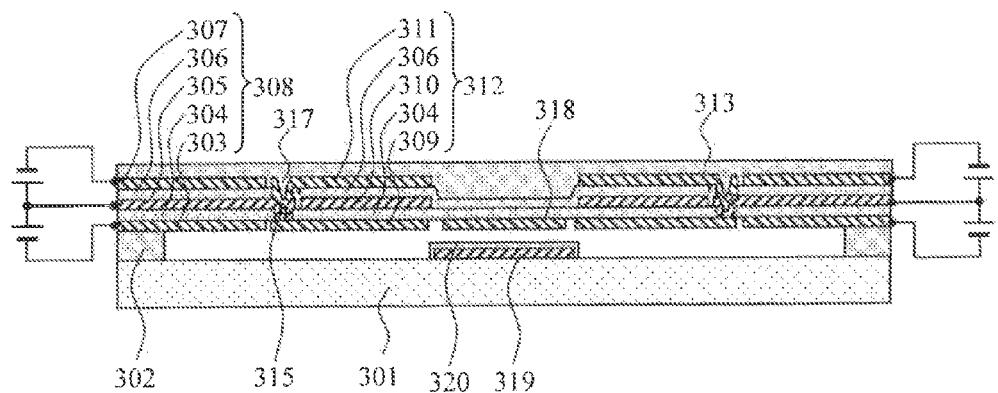
FIG. 9 is a cross sectional view of the variable capacitor using the thin film piezoelectric actuator of the second example of the present invention (the section B-B shown in FIG. 7)

As shown in FIGS. 8 and 9, a first driving part 308 in contact with anchors 302 on both sides provided on a substrate 301, which is composed of a first lower electrode 303, a first piezoelectric film 304, a first intermediate electrode 305, a second piezoelectric film 306, and a first upper electrode 307 and a second driving part 312 provided in the neighborhood of the first driving part 308, which is composed of a second lower electrode 309, the first piezoelectric film 304, a second intermediate electrode 310, the second piezoelectric film 306, and a second upper electrode 311 are provided. As illustrated in FIG. 1, the support film 110 may be provided under the lower electrodes or above the upper electrodes. With respect to the first and second driving parts 308 and 312, two sets are respectively provided symmetrically along the driving shaft of the center beam. The first piezoelectric film 304 and the second piezoelectric film 306 can be polarized in the same direction.

As shown in FIGS. 7 to 9, in the first piezoelectric film 304, between the first driving part 308 and the second driving part 312, a first via hole 314 and a second via hole 315 are formed side by side perpendicularly to the driving shaft and moreover in the second piezoelectric film 306, in the same positions on the plane as those of the first and second via holes 314 and 315, third and fourth via holes 316 and 317 are formed side by side.

The first lower electrode 303 and the second intermediate electrode 310 are connected via the first via hole 314 and moreover are connected to the first upper electrode 307 via the third via hole 316. Further, the second lower electrode 309 and the first intermediate electrode 305 are connected via the second via hole 315 and moreover are connected to the second upper electrode 311 via the fourth via hole 317.

Further, at the central part of the actuator, a first electrode 318 of the variable capacitor is formed and on the opposite substrate 301, a second electrode 319 of the variable capacitor and a dielectric film 320 for preventing a short circuit between the electrodes are formed.

The first and second upper, intermediate, and lower electrodes 303, 305, 307, 309, 310, and 311 of the actuator and the electrodes 318 and 319 of the variable capacitor are all made of Al and are set to a thickness of 50 nm. The equivalent area of the variable capacitor is set to 6400 $\mu m^2$, and the dielectric film 320 is made of AlN, and the thickness is set to 10 nm.

When a control voltage ($V_{tune}$) of 0 to 3 V is applied between the first intermediate electrode and the first upper and lower electrodes of the variable capacitor to which the thin film piezoelectric actuator is applied and the capacity between the first electrode 318 of the variable capacitor and the second electrode 319 thereof is measured, a very large variable width from a minimum of 0.27 pF to a maximum of 5.5 pF, that is, 20 times can be obtained continuously.

Figure 10:
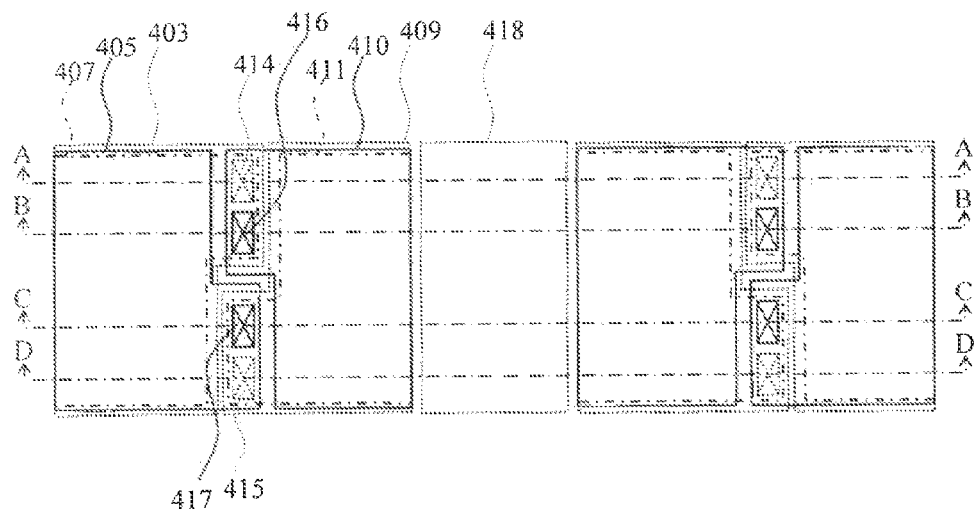
FIG. 10 is a top view of a variable capacitor using the thin film piezoelectric actuator of the third example of the present invention.

FIG. 10 shows a plan view of a variable capacitor to which the thin film piezoelectric actuator of a double-clamped beam structure of the third example of the present invention is applied. The section A-A of the plan view shown in FIG. 10, the section B-B, the section C-C, and the section D-D are shown respectively in FIGS. 11, 12, 13, and 14. Further, in the plan view shown in FIG. 10, to avoid complication, only the upper and lower electrodes and via holes are shown.

Figure 11:
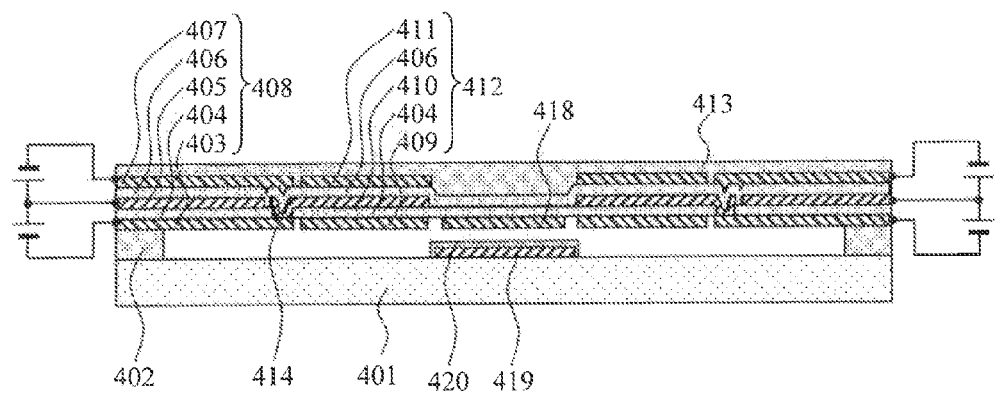
FIG. 11 is a cross sectional view of the variable capacitor using the thin film piezoelectric actuator of the third example of the present invention (the section A-A shown in FIG. 10)
Figure 12:
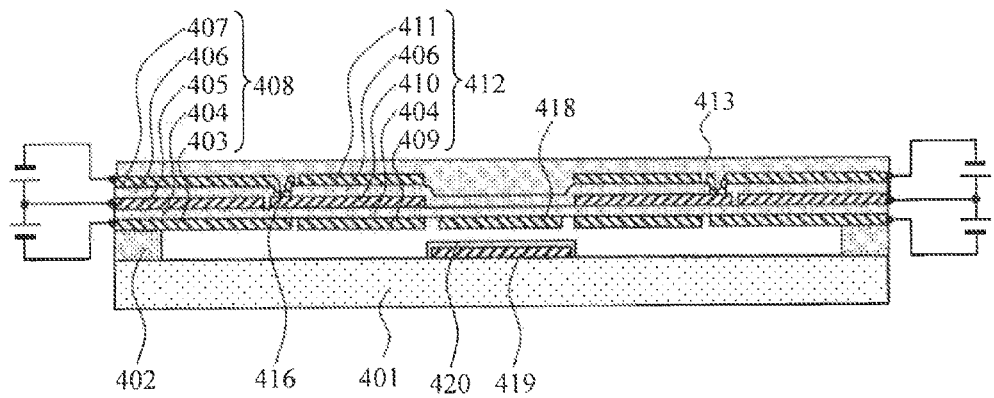
FIG. 12 is a cross sectional view of the variable capacitor using the thin film piezoelectric actuator of the third example of the present invention (the section B-B shown in FIG. 10)
Figure 13:
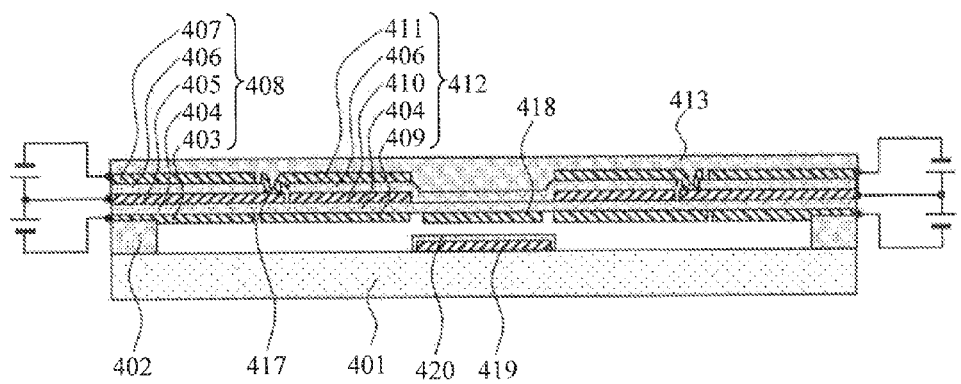
FIG. 13 is a cross sectional view of the variable capacitor using the thin film piezoelectric actuator of the third example of the present invention (the section C-C shown in FIG. 10)
Figure 14:
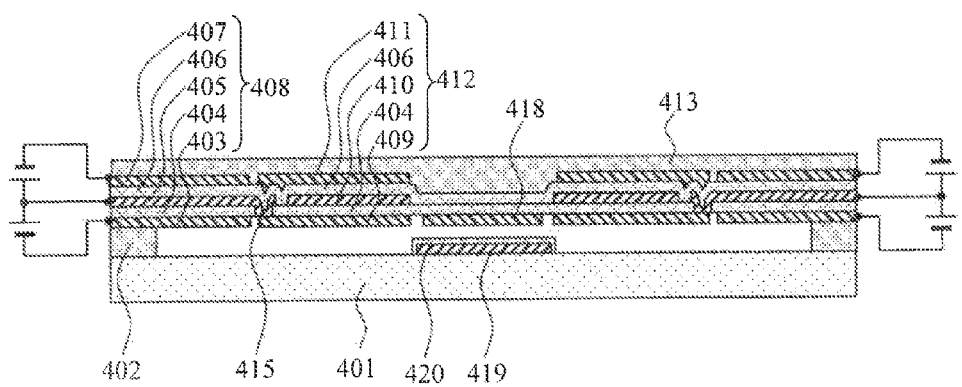
FIG. 14 is a cross sectional view of the variable capacitor using the thin film piezoelectric actuator of the third example of the present invention (the section D-D shown in FIG. 10)

As shown in FIGS. 11 and 14, a first driving part 408 in contact with anchors 402 on both sides provided on a substrate 401, which is composed of a first lower electrode 403, a first piezoelectric film 404, a first intermediate electrode 405, a second piezoelectric film 406, and a first upper electrode 407 and a second driving part 412 provided in the neighborhood of the first driving part 408, which is composed of a second lower electrode 409, the first piezoelectric film 404, a second intermediate electrode 410, the second piezoelectric film 406, and a second upper electrode 11 are provided. With respect to the first and second driving parts 408 and 412, two sets are respectively provided symmetrically along the driving shaft of the center beam.

As shown in FIGS. 10 to 14, in the first piezoelectric film 404, between the first driving part 408 and the second driving part 412, a first via hole 414 and a second via hole 415 are formed perpendicularly to the driving shaft and moreover in the second piezoelectric film 406, respectively in the neighborhood of the first and second via holes 414 and 415, third and fourth via holes 416 and 417 are formed side by side.

The first lower electrode 403 and the second intermediate electrode 410 are connected via the first via hole 414 and moreover are connected to the first upper electrode 407 via the third via hole 416. Further, the second lower electrode 409 and the first intermediate electrode 405 are connected via the second via hole 415 and moreover are connected to the second upper electrode 411 via the fourth via hole 417.

Further, at the central part of the actuator, a first electrode 418 of the variable capacitor is formed and on the opposite substrate 401, a second electrode 419 of the variable capacitor and a dielectric film 420 for preventing a short circuit between the electrodes are formed.

The first and second upper, intermediate, and lower electrodes 403, 405, 407, 409, 410, and 411 of the actuator and the electrodes 418 and 419 of the variable capacitor are all made of Al and are set to a thickness of 50 nm. Further, the piezoelectric films 404 and 406 of the actuator are made of AlN orientated in the c-axis and are all set to a thickness of 400 nm. The equivalent area of the variable capacitor is set to 6400 $\mu m^2$ and the dielectric film 115 is made of AlN and the thickness is set to 10 nm.

When a control voltage ($V_{tune}$) of 0 to 3 V is applied between the first intermediate electrode and the first upper and lower electrodes of the variable capacitor to which the thin film piezoelectric actuator is applied and the capacity between the first electrode 418 of the variable capacitor and the second electrode 419 thereof is measured, a very large variable width from a minimum of 0.31 pF to a maximum of 6.8 pF, that is, 21 times can be obtained continuously.

In this example, compared with the actuator of the second example shown in FIGS. 7 to 9, the first to fourth via holes are formed respectively in different positions in the perpendicular direction to the driving shaft, so that there are no uneven parts due to forming of the via holes. Therefore, stage discontinuation at the time of connection can be prevented easily and the strength of the whole actuator is improved.

Figure 15:
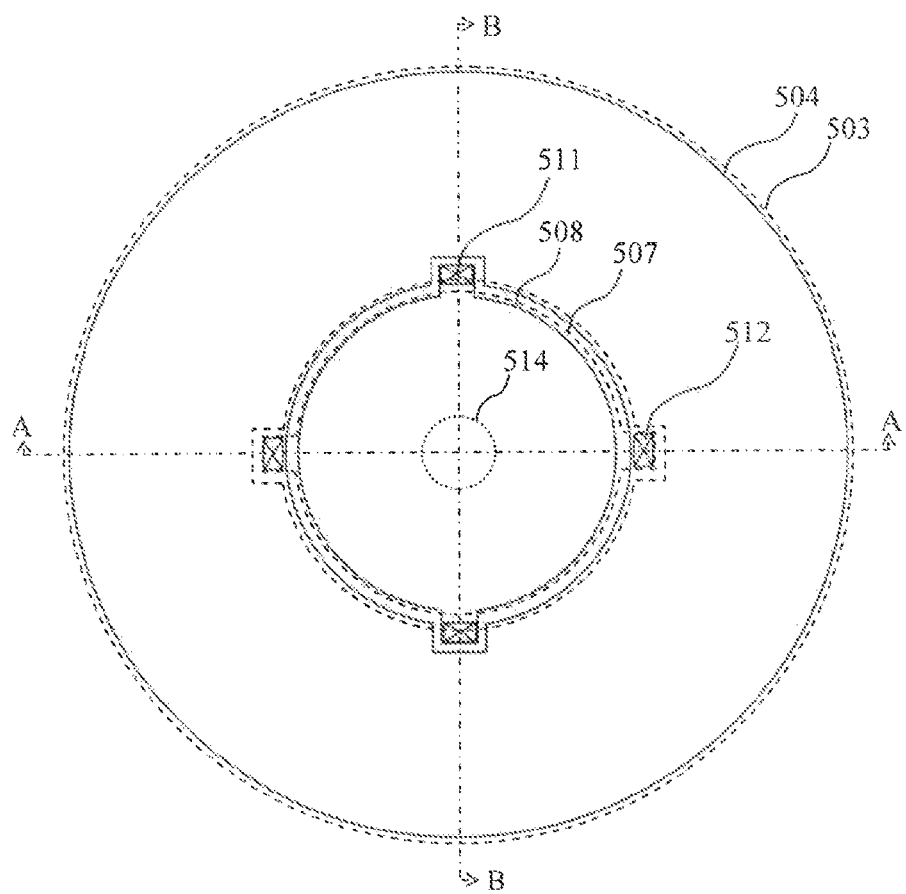
FIG. 15 is a top view of a variable capacitor using the thin film piezoelectric actuator of the fourth example of the present invention.

FIG. 15 shows a plan view of a variable capacitor to which the thin film piezoelectric actuator of the fourth example of the present invention is applied. This example, in place of the linear thin film piezoelectric actuator of a double-clamped beam structure shown in Examples 1 to 3, uses a circular thin film piezoelectric actuator. The section A-A of the plan view shown in FIG. 15 and the section B-B thereof are shown respectively in FIGS. 16 and 17. Further, in the plan view shown in FIG. 10, to avoid complication, only the upper and lower electrodes and via hole unit are shown.

Figure 16:
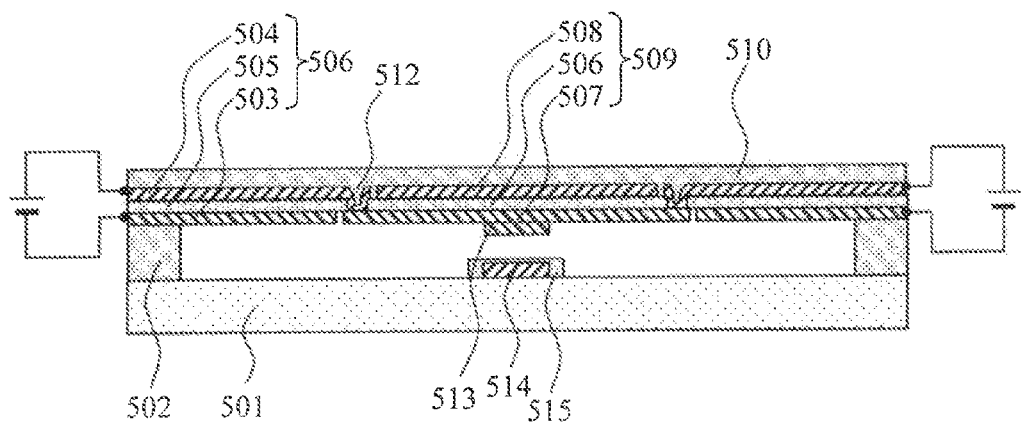
FIG. 16 is a cross sectional view of the variable capacitor using the thin film piezoelectric actuator of the fourth example of the present invention (the section A-A shown in FIG. 15)
Figure 17:
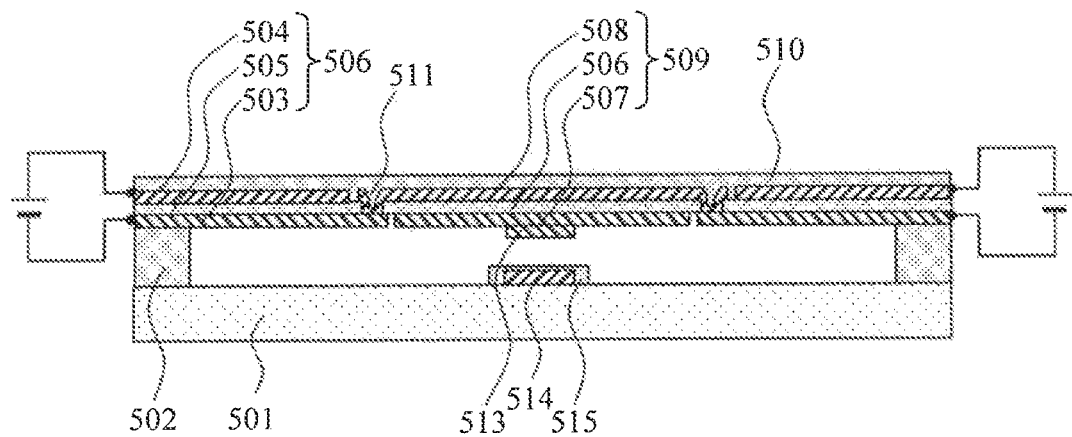
FIG. 17 is a cross sectional view of the variable capacitor using the thin film piezoelectric actuator of the fourth example of the present invention (the section B-B shown in FIG. 15)

As shown in FIGS. 16 and 17, a first driving part 506 in contact with anchors 502 on both sides provided on a substrate 501, which is composed of first upper and lower electrodes 503 and 504 and a first piezoelectric film 505 held by them, a second driving part 509 provided in the neighborhood of the first driving part 506, which is composed of second upper and lower electrodes 507 and 508 and the piezoelectric film 505 held by them, and a support film 510 for forming a bimorph structure are provided. The first driving part 506 is provided in a doughnut shape and the second driving part 509 is provided in a round shape inside the first driving part 506.

In the piezoelectric film 505, between the first driving part 506 and the second driving part 509, a first via hole 511 and a second via hole 512 are formed on the concentric circle along the radial driving shaft, and the first lower electrode 503 and the second upper electrode 508 are connected through the first via hole 511, and the second lower electrode 507 and the first upper electrode 504 are connected through the second via hole 512.

Further, at the central part of the actuator, a first electrode 513 of the variable capacitor is formed and on the opposite substrate 501, a second electrode 514 of the variable capacitor and a dielectric film 515 for preventing a short circuit between the electrodes are provided.

The first and second upper and lower electrodes 503, 504, 507, and 508 of the actuator are made of Al and are all set to a thickness of 50 nm. Further, the piezoelectric film 505 of the actuator is made of ZnO orientated in the c-axis and is set to a thickness of 500 nm. The equivalent area of the variable capacitor is set to 5800 $\mu m^2$ and the dielectric film 515 is made of ZnO and the thickness is set to 10 nm.

When a control voltage ($V_{tune}$) of 0 to 3 V is applied between the first upper and lower electrodes of the variable capacitor to which the thin film piezoelectric actuator is applied and the capacity between the first electrode 513 of the variable capacitor and the second electrode 514 thereof is measured, a very large variable width from a minimum of 0.22 pF to a maximum of 5.1 pF, that is, 25 times can be obtained continuously.

In this example, the thin film piezoelectric actuator is formed in a round shape, so that the area of the actuator is increased slightly, though the rigidity and driving force are improved and the operation is speeded up.

Second Embodiment

Next, as the second embodiment of the present invention, a thin film piezoelectric actuator in which the end of the electrode provided under the piezoelectric film is tapered will be explained.

Figure 18:
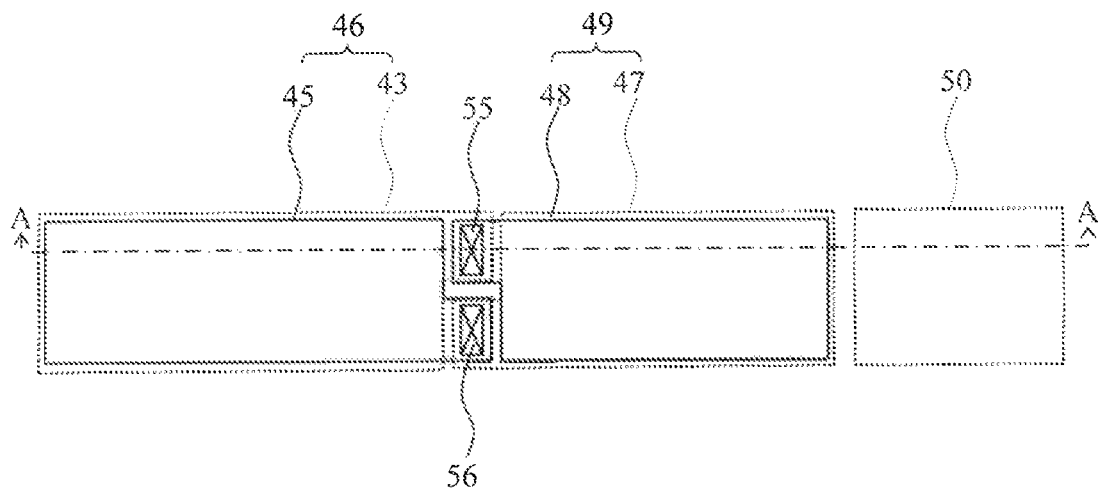
FIG. 18 is a plan view of the thin film piezoelectric actuator of a cantilever beam structure of the fifth example of the present invention.

FIG. 18 is a plan view of the thin film piezoelectric actuator of a cantilever beam structure of the fifth example of the present invention.

Figure 19:
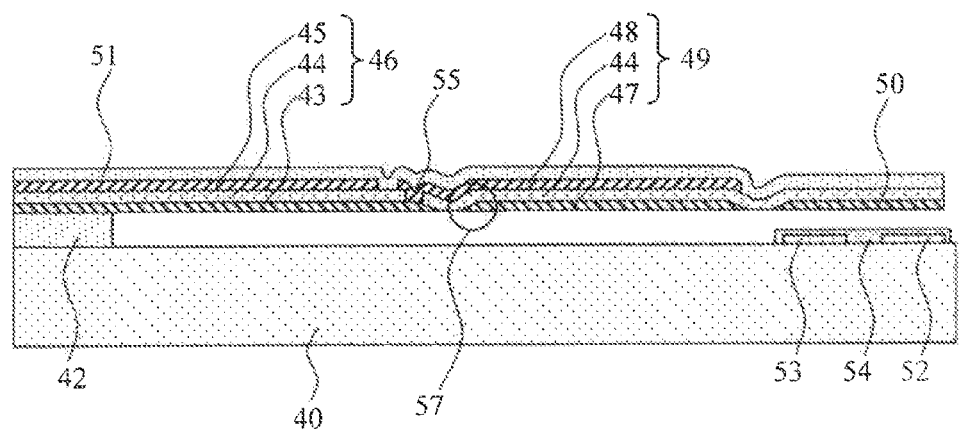
FIG. 19 is a cross sectional view of the section A-A shown in FIG. 18.

Further, FIG. 19 is a cross sectional view of the line A-A shown in FIG. 18. Further, in the plan view of FIG. 18, to avoid complication, only the upper and lower electrodes and via holes formed in the piezoelectric film are shown.

As shown in FIGS. 18 and 19, a first driving part 46 in contact with an anchor 42 provided on a substrate 40, which is composed of a piezoelectric film 44 held by first upper and lower electrodes 45 and 43, a second driving part 49 provided in the neighborhood of the first driving part, which is composed of the piezoelectric film 44 held by second upper and lower electrodes 48 and 47, and a support film 51 for forming an asymmetrical bimorph structure are provided.

In the piezoelectric film 44, between the first driving part 46 and the second driving part 49, a first via hole 55 and a second via hole 56 are formed side by side perpendicularly to the driving shaft. The first upper electrode 45 and the second lower electrode 47 are connected through the second via hole 56. The second upper electrode 48 and the first lower electrode 43 are connected through the first via hole 55.

Further, at the right end of the actuator, a movable electrode 50 of the variable capacitor is formed and on the opposite substrate 40, two fixed electrodes 52 and 53 of the variable capacitor and a dielectric film 54 for preventing a short circuit between the electrodes are provided.

The upper and lower electrodes of the actuator are made of, for example, Al (aluminum) and the thickness thereof, in consideration of the resistance, can be set to, for example, about 10 nm to 1 μm. In this example, they are all set to 50 nm. Further, the piezoelectric film of the actuator is made of AlN (aluminum nitride) orientated in the c-axis and the thickness, in consideration of the displacement amount, can be set to, for example, about 10 nm to 1 μm. In this example, the thickness is set to 500 nm.

The support film 51 is made of a $SiO_2$ film and the thickness is set to 500 nm. The equivalent area of the variable capacitor is set to 6400 μm², and the dielectric film 54 is made of AlN, and the thickness is set to 10 nm.

Figure 20:
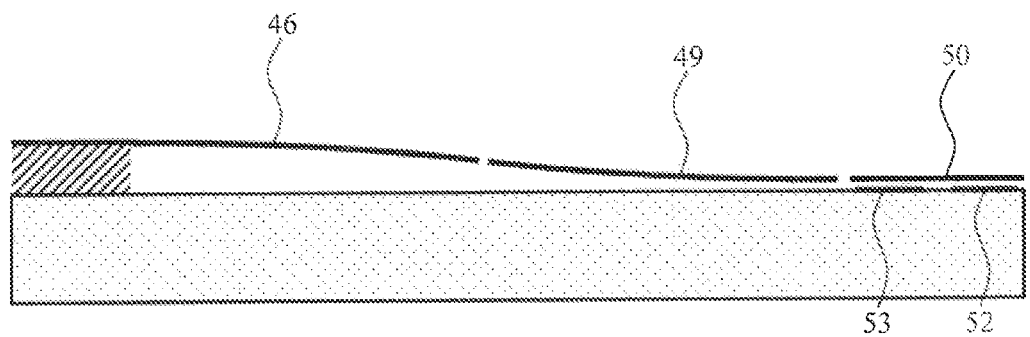
FIG. 20 is a schematic view for explaining the operation of the actuator of the fifth concrete example.

FIG. 20 is a schematic view for explaining the operation of the actuator of the concrete example.

Namely, in the actuator of this example, the first actuator unit 46 and the second actuator unit 49 are respectively deformed inversely, thus the inclination of the movable electrode 50 is canceled, and the movable electrode 50 of the variable capacitor prepared at the front end of the actuator can move in parallel.

And, in this example, the ends of the electrodes 43, 47, and 50 which are lower layers of the piezoelectric film 44 are tapered. It is, for example, as indicated by numeral 57. The ends of the lower layers of the piezoelectric film are tapered like this, thus the piezoelectric film can be prevented from an occurrence of splitting and cracking at this part. Hereinafter, this respect will be explained in detail by referring to the comparison example.

Figure 21:
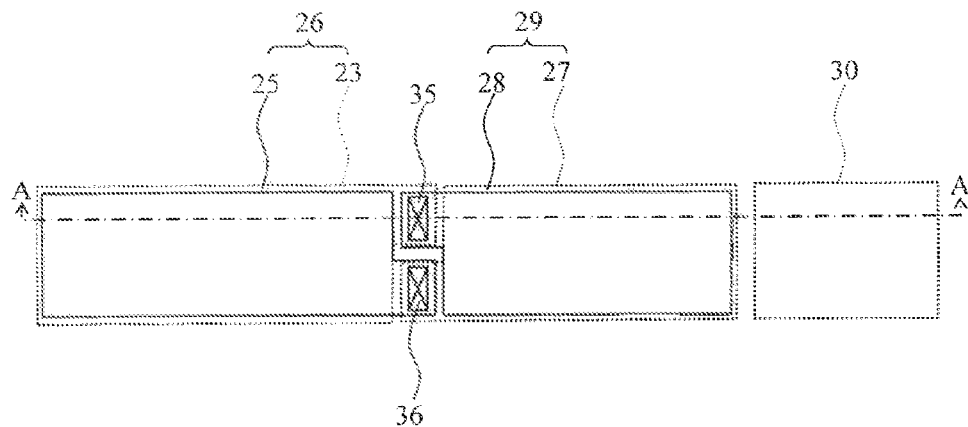
FIG. 21 is a plan view of the thin film piezoelectric actuator of the comparison example.

FIG. 21 is a plan view of the thin film piezoelectric actuator of the comparison example.

Figure 22:
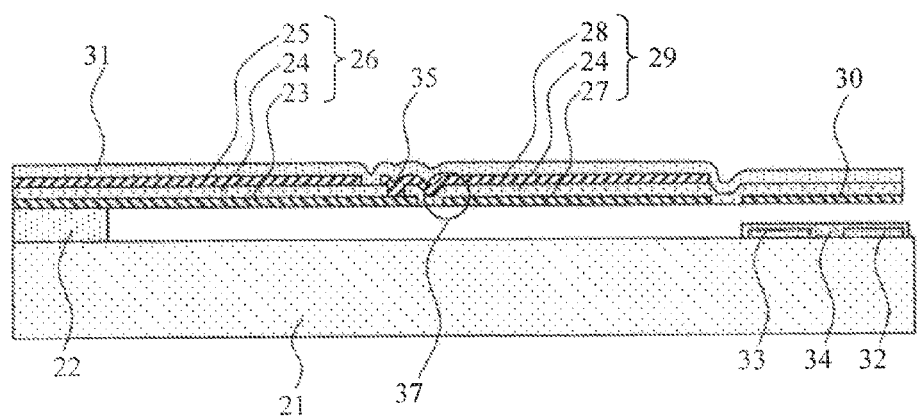
FIG. 22 is a cross sectional view of the section A-A shown in FIG. 21.

Further, FIG. 22 is a cross sectional view of the line A-A shown in FIG. 21. Further, in the plan view of FIG. 21, to avoid complication, only the lower electrode, upper electrode, and via holes formed in the piezoelectric film are shown.

Also in this comparison example, the arrangement relationship between the elements is almost similar to that of the fifth example.

Namely, the thin film piezoelectric actuator includes a first actuator 26 in contact with an anchor 22 provided on a substrate 21, which is composed of a piezoelectric body 24 and a support film 31 which are held by upper and lower electrodes 25 and 23, and a second actuator 29 having upper electrodes 28 and 27. At the front end of the second actuator, a movable electrode 30 of the variable capacitor, which is insulated and separated, is provided. Opposite to the movable electrode 30, on the substrate, a first fixed electrode 32 and a second fixed electrode 33 of the variable capacitor are provided. The fixed electrodes 32 and 33, to prevent a short circuit with the movable electrode, are covered with a dielectric film 34. Further, the first lower electrode 23 is connected to the second upper electrode 28 via a via hole 35 formed in the piezoelectric film 24 and the first upper electrode 25 is connected to the second lower electrode 27 via a via hole 36 formed in the piezoelectric film 24.

When a voltage is applied between the first upper electrode 25 and the lower electrode 23 of the first actuator, the first actuator is deformed convexly upward, and the second actuator is deformed convexly downward because the polarities of the upper and lower electrodes are reversed, and the "S-mode" actuator illustrated in FIG. 20 is realized, and the movable electrode 30 is driven in parallel with the substrate.

However, in the process of trial manufacture and examination of the inventors, when Al is actually used for the upper and lower electrodes, and AlN is used for the piezoelectric film, and moreover $SiO_2$ is used for the support film, and film deposition and patterning are executed by the sputtering method, and a variable capacitor is produced, at the time of end of the process and during the operation of the variable capacitor, in a boundary neighborhood 37 of the first lower electrode 23 and the second lower electrode 27 and in the boundary neighborhood of the second lower electrode 27 and the movable electrode 30, cracking occurs and the electrodes are broken.

Figure 23:
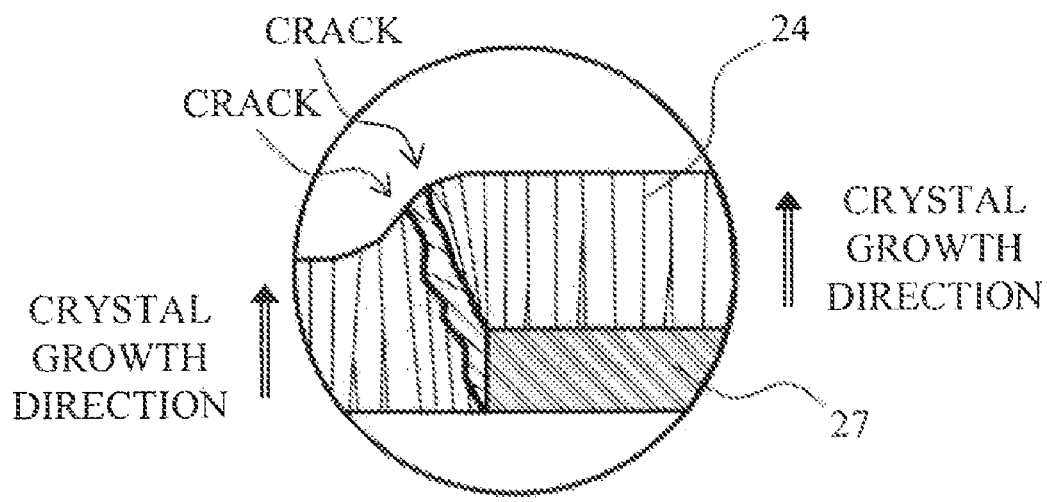
FIG. 23 is a partially enlarged schematic sectional view showing cracks occurring in the comparison example.

FIG. 23 is a partially enlarged schematic sectional view showing cracks occurring in the comparison example.

Namely, in this comparison example, the end of the lower electrode 27 forms an almost perpendicular level difference. And, in the level different portion, the piezoelectric film 24 is cracked.

Such cracking is easily caused in a piezoelectric actuator having a structure as illustrated in FIGS. 18 to 22 that the lower electrodes and upper electrodes are divided and it is found first that when this state is kept unchanged, manufacture by the thin film method is very difficult.

The inventors, on the basis of the experiment and observation on what mechanism causes cracking, examined the results in detail and discovered the following new facts.

(1) Breaking is caused by cracking occurred in the AlN piezoelectric film from the end face of the lower electrode.

(2) The end face of the lower electrode is inclined at 60° or more with the substrate surface and only when the piezoelectric film is made of AlN or ZnO which is orientated in the c-axis, it is cracked.

Namely, AlN and ZnO have a hexagonal crystal structure, and as schematically shown in FIG. 23 in the structure crystal growth easily occurs orientated in the c-axis and at that time, the crystal is apt to grow perpendicularly to the base surface. When the piezoelectric films are formed on the patterned lower electrode and the end face of the lower electrode is almost perpendicular to the substrate surface such as 60° or more, it is found that in the corners of the end face, the crystal growth direction is greatly disordered, and cracks and gaps are caused, and the piezoelectric films are cracked.

On the other hand, when the end face of the lower electrode is tapered at an angle of 30° or less with the substrate surface, it is found that even in the corners of the end face, the crystal growth direction is changed slowly and gaps and cracks are not caused.

Figure 24:
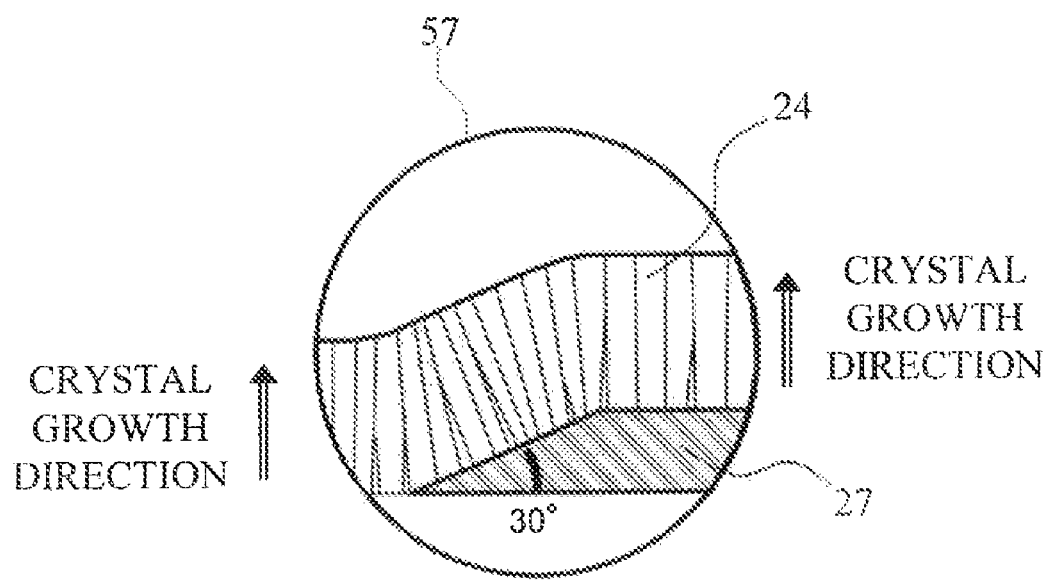
FIG. 24 is a partially enlarged sectional view of a structure that the end of the lower layer is tapered.

FIG. 24 is a partially enlarged sectional view of a structure that the end of the lower layer is tapered. Namely, the drawing corresponds to an enlarged drawing of the part indicated numeral 57 shown in FIG. 19.

On the top of the lower electrode, the tapered end face, and the part where the lower electrode is removed, the AlN piezoelectric film orientated in the c-axis is grown almost evenly in the direction of the film thickness and no cracks are seen at all. The inventors variously changed the tapered angle (the angle of the end face of the lower layer formed with the main surface of the lower layer) at the end of the lower layer and checked an occurrence of cracking of the piezoelectric film.

Figure 25:
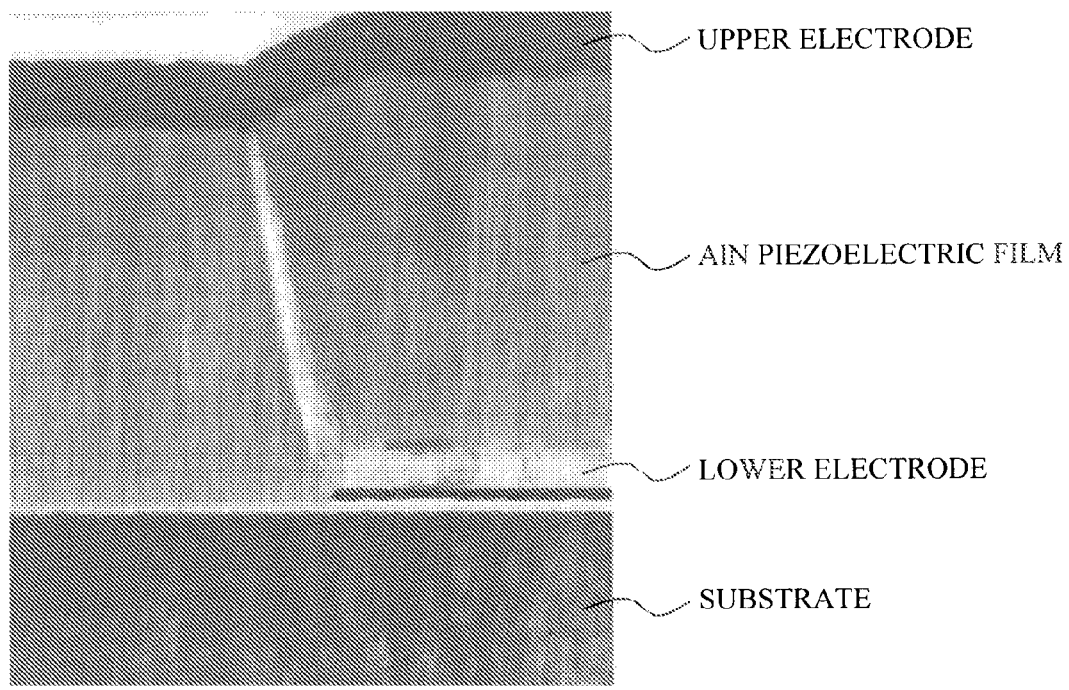
FIG. 25 is a photograph of an enlarged part of the sectional structure of an actuator produced by way of trial and evaluated by the inventors.
Figure 26:
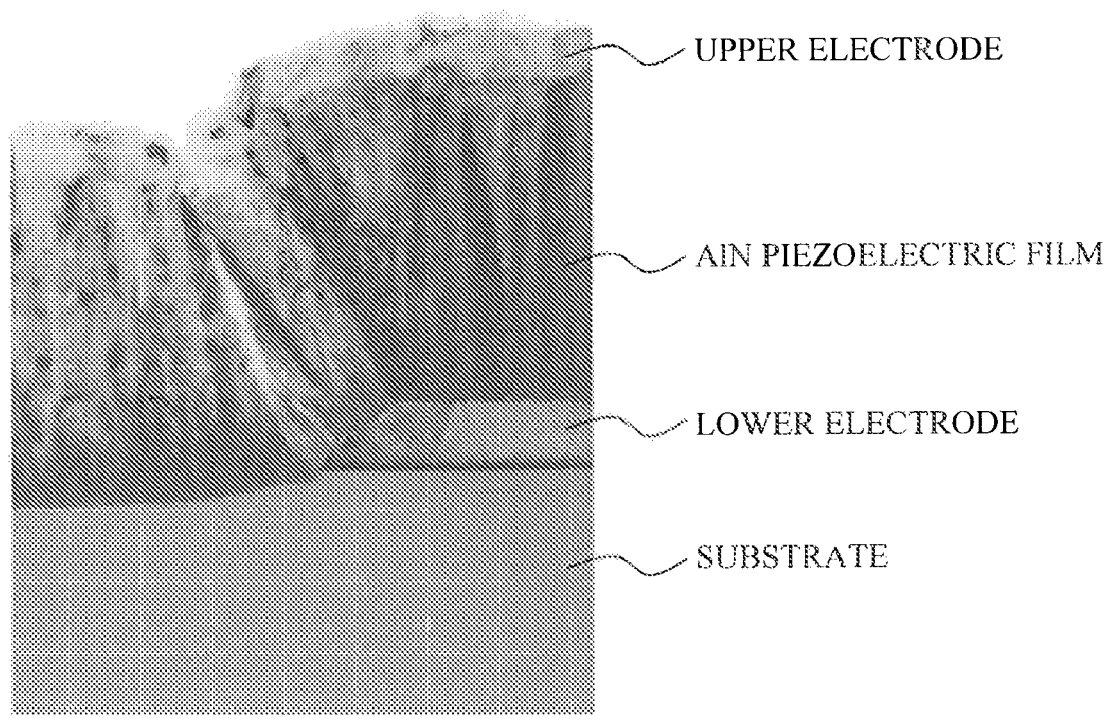
FIG. 26 is a photograph of an enlarged part of the sectional structure of an actuator produced by way of trial and evaluated by the inventors.
Figure 27:
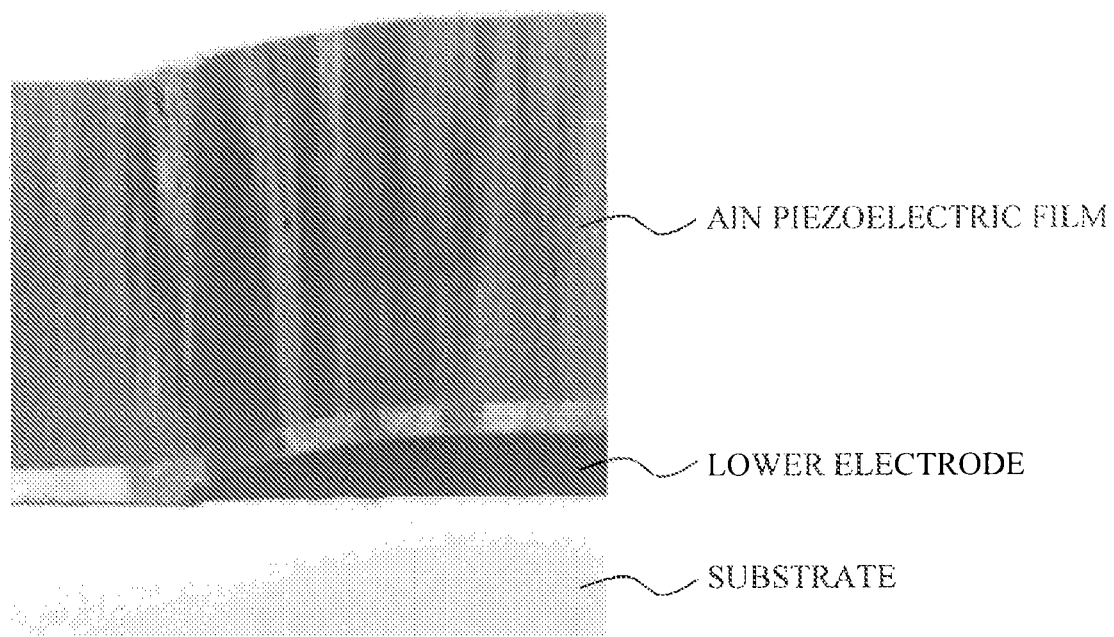
FIG. 27 is a photograph of an enlarged part of the sectional structure of an actuator produced by way of trial and evaluated by the inventors.

FIGS. 25 to 28 are photographs of an enlarged part of the sectional structure of an actuator which is produced by way of trial and evaluated by the inventors. Namely, FIG. 25 shows a case that the tapered angle of the lower electrode is 80°, and FIG. 26 shows a case that the tapered angle of the lower electrode is 60°, and FIG. 27 shows a case that the tapered angle of the lower electrode is 25°.

When the tapered angle is 80° (FIG. 25) or 60° (FIG. 26), it is found that clear cracking occurs in the AlN piezoelectric film from the end of the lower electrode. On the other hand, when the tapered angle is 25° (FIG. 27), it is found that splitting and cracking are not observed in the AlN piezoelectric film and the AlN piezoelectric film orientated in the c-axis is grown almost evenly in the direction of the film thickness. Further, for this sample, when the full width at half maximum of rocking curve orientation in the omega scanning mode is measured by X-ray diffraction, the full width at half maximum of the (0001) diffraction peak from the AlN piezoelectric film is 1.2° and it is found that an AlN film orientated very satisfactorily is formed.

Table 1 summarizes the relationship between the tapered angle and the existence of cracking of the AlN piezoelectric film by the trial manufacture and experiment executed by the inventors.

TABLE 1

| Tapered angle | Existence of cracking |
|---|---|
| 90 | Clear cracking |
| 80 | Clear cracking |
| 70 | Clear cracking |
| 60 | Clear cracking |
| 50 | Not clear cracking |
| 40 | Not clear cracking |
| 30 | No cracking |
| 20 | No cracking |

When the tapered angle of the end face is above 30° up to less than 60°, breaking and non-breaking coexist. Namely, the angle of the end face must be desirably up to 30°, and at least up to 60°.

Further, the material to be used for electrodes of a thin film piezoelectric actuator, from the viewpoint of specific resistivity and producibility of thin films, is desirably a metal of a low resistance such as aluminum (Al), gold (Au), platinum (Pt), copper (Cu), indium (Ir), tungsten (W), or molybdenum (Mo). The end faces of these electrodes can be taper-etched by a method which will be described later in detail.

Further, the piezoelectric film, as described above, is desirably made of AlN or ZnO and from the viewpoint of sufficiently taking out the piezoelectric property, the component is desirably of a hexagonal crystal strongly orientated in the c-axis which can generate a piezoelectric property. The reason is that when the full width at half maximum is larger than 5°, the piezoelectric property cannot be taken out sufficiently, and the piezoelectric property of the piezoelectric film on the wafer surface is varied greatly, thus the device property is varied, and the yield is reduced.

Next, the manufacturing method of the thin film piezoelectric actuator of this example will be explained.

FIG. 28 shows step sectional views showing the essential sections of the manufacturing method of the thin film piezoelectric actuator of this example.

Figure 28A:
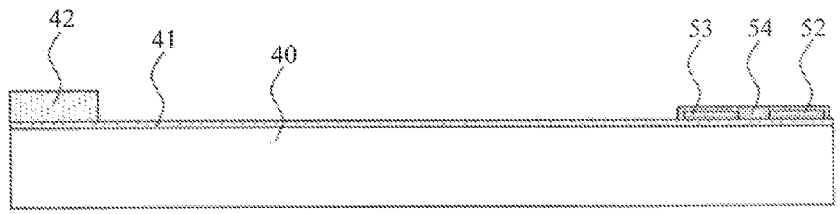
FIGS. 28 A-D are step sectional views showing the essential sections of the manufacturing method of the thin film piezoelectric actuator of the fifth example.

Firstly, as shown in FIG. 28A, on the Si substrate 40 on the surface of which an oxide film 41 is formed, by film deposition and patterning by the known CVD method, the anchor 42 composed of SiN is prepared. Similarly, the fixed electrodes 52 and 53 made of Al are prepared by the sputtering method and patterning, and then the dielectric film 54 is further prepared on the surfaces of the fixed electrodes by the CVD method and patterning.

Figure 28B:
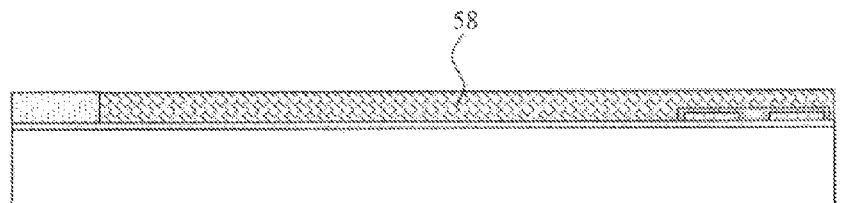

Next, as shown in FIG. 28B, a polysilicon layer 58 is prepared conformally by the CVD method, and then the surface thereof is smoothed by chemical mechanical polishing (CMP), and the anchor 42 is exposed on the surface.

Figure 28C:
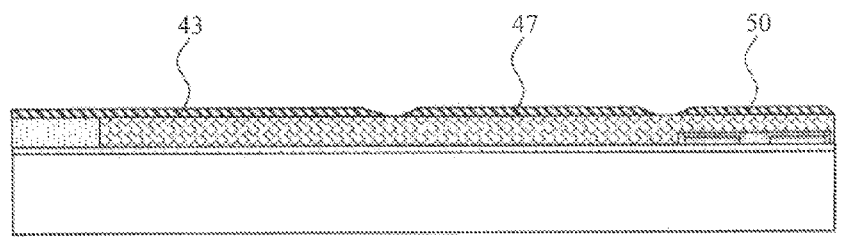

Next, as shown in FIG. 28C, an electrode film is formed by the sputtering method and is patterned and the first lower electrode 43, the second lower electrode 47, and the movable electrode 50 of the variable capacitor are prepared. At this time, to form an angle of up to 30° at the end of the lower electrode, it is taper-etched using a taper-shaped resist.

Concretely, the end of the lower electrode is coated with a novolak positive resist, is pre-baked and exposed, and then is baked at 180° C. and the resist end is reflowed in a tapered shape at 20°. Using the tapered resist, by the reactive ion etching (IE) method using chlorine etching gas, the end of the lower electrode is etched while moving back the resist and as a result, is tapered at an angle of 25°.

Figure 28D:
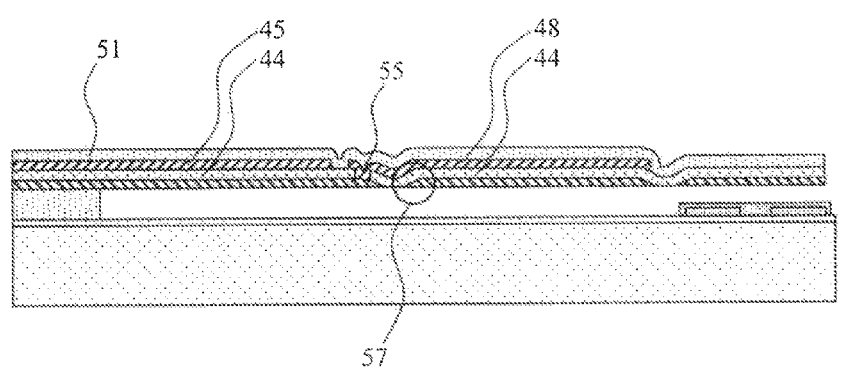

Next, as shown in FIG. 28D, by film deposition by the sputtering method and patterning, the piezoelectric films 44 made of AlN strongly orientated, the first and second upper electrodes 45 and 48 made of Al, and the support film 51 made of silicon oxide are prepared. Furthermore, by the dry etching using xenon fluoride as an etchant, the sacrificial layer 58 is selectively etched and removed. Further, the silicon oxide support film is of an amorphous structure, so that even if the upper electrode is not taper-etched, the corners are not cracked.

The sectional structure of the lower electrode end 57 after preparation is as shown in FIG. 27. Namely, on the top of the lower electrode, the tapered end face, and the part where the lower electrode is removed, the AlN piezoelectric film orientated in the c-axis is grown almost evenly in the direction of the film thickness and no cracks are seen at all.

Further, when the crystal orientations are measured by X-ray diffraction in the omega scanning mode, the full width at half maximum of the (0001) peak is 1.2° and it is found that AlN film which is orientated very satisfactorily is formed.

When a control voltage ($V_{tune}$) of 0 to 3 V to the actuator is applied between the first lower electrode 43 and the first upper electrode 45 and the variable capacitor capacity between the first fixed electrode 52 and the second fixed electrode 53 is measured, a very large variable width from a minimum of 0.34 pF to a maximum of 5.1 pF, that is, 15 times can be obtained continuously.

Next, as the sixth example, a symmetrical bimorph actuator using the first and second piezoelectric films will be explained.

Figure 29:
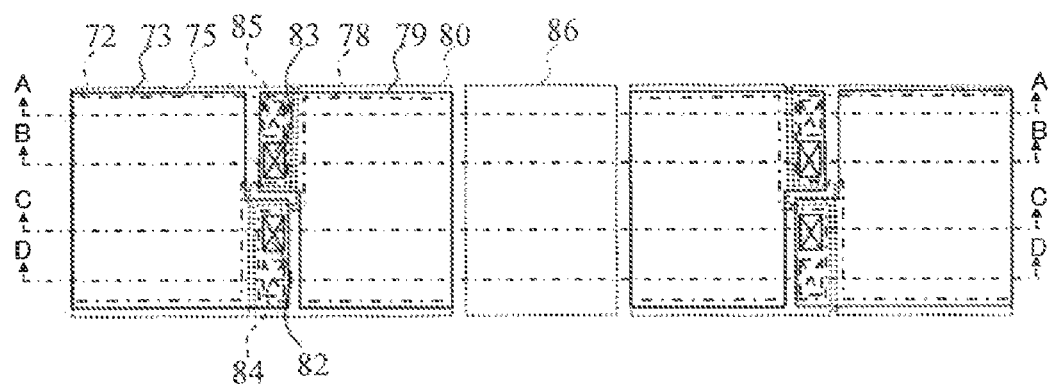
FIG. 29 is a plan view of the thin film piezoelectric actuator of a double-clamped beam structure of the sixth example of the present invention.

FIG. 29 is a plan view of the thin film piezoelectric actuator of a double-clamped beam structure of this example.

Figure 30:
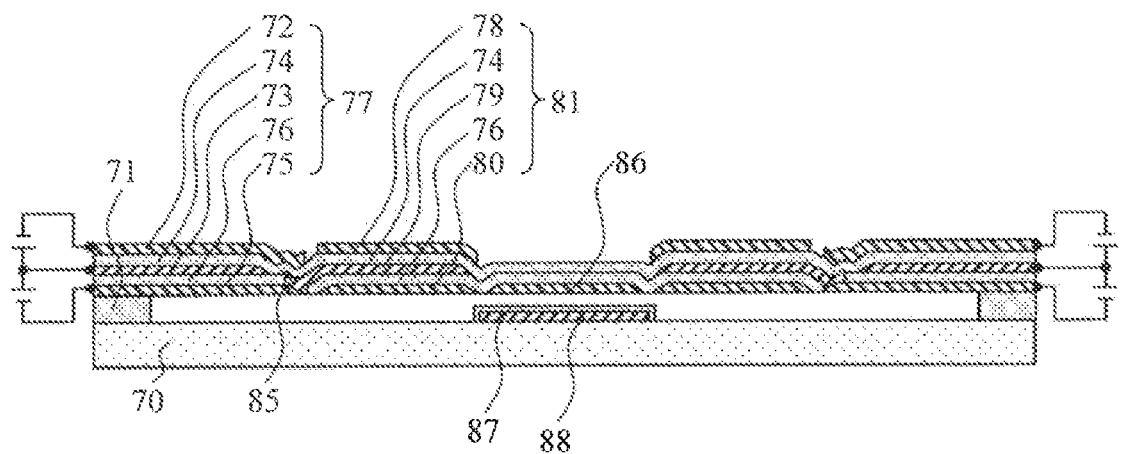
FIG. 30 is a schematic view showing the section A-A shown in FIG. 29.

FIG. 30 is a schematic view showing the section A-A shown in FIG. 29.

Figure 31:
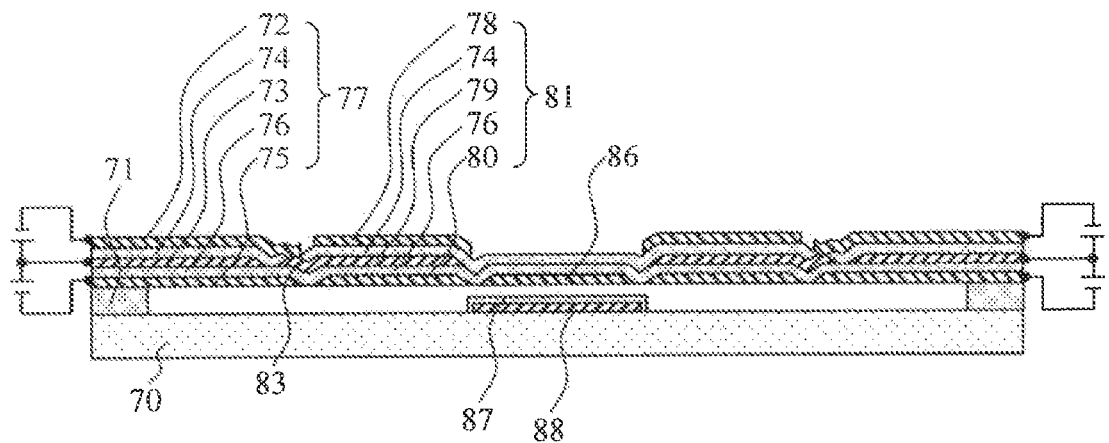
FIG. 31 is a schematic view showing the section B-B shown in FIG. 29.

FIG. 31 is a schematic view showing the section B-B shown in FIG. 29.

Figure 32:
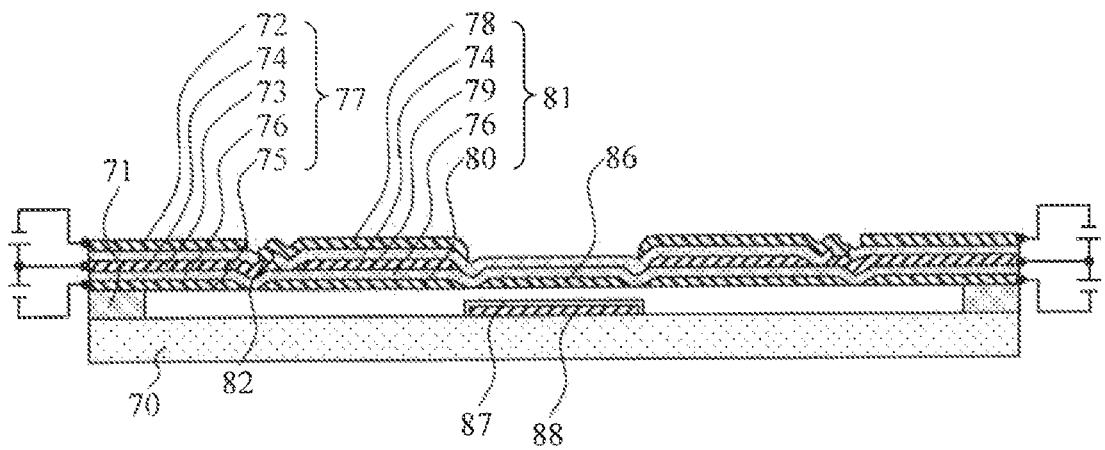
FIG. 32 is a schematic view showing the section C-C shown in FIG. 29.

FIG. 32 is a schematic view showing the section C-C shown in FIG. 29.

Figure 33:
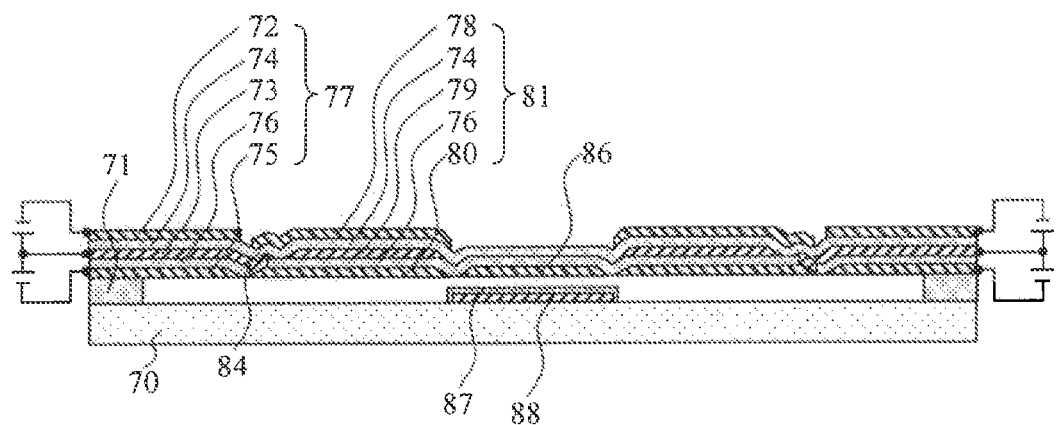
FIG. 33 is a schematic view showing the section D-D shown in FIG. 29.

FIG. 33 is a schematic view showing the section D-D shown in FIG. 29.

In the plan view shown in FIG. 29, to avoid complication, only the upper, intermediate, and lower electrodes are shown.

In this example, as shown in FIG. 29 to 33, a first driving part 77 in contact with anchors 71 on both sides provided on a substrate 70, which is composed of a first upper electrode 72, a first piezoelectric film 74, a first intermediate electrode 73, a second piezoelectric film 76, and a first lower electrode 75 and a second driving part 81 provided in the neighborhood of the first driving part, which is composed of a second upper electrode 78, the first piezoelectric film 74, a second intermediate electrode 79, the second piezoelectric film 76, and a second lower electrode 80 are provided. With respect to the first and second driving parts, two sets are respectively provided symmetrically along the driving shaft of the center beam.

As shown in FIG. 29, in the first piezoelectric film 74, between the first driving part 77 and the second driving part 81, a first via hole 82 and a second via hole 83 are formed side by side perpendicularly to the driving shaft. Furthermore, in the second piezoelectric film 76, in the neighborhood of the first and second via holes 82 and 83, third and fourth via holes 84 and 85 are formed.

The first lower electrode 72 and the second intermediate electrode 79 are connected via the first via hole 82 and moreover are connected to the first upper electrode 75 via the third via hole 84. Further, the second upper electrode 78 and the first intermediate electrode 73 are connected via the second via hole 83 and moreover are connected to the second lower electrode 80 via the fourth via hole 85.

Further, at the central part of the actuator, a movable electrode 86 of the variable capacitor is formed and on the opposite substrate 70, a fixed electrode 88 of the variable capacitor and a dielectric film 87 for preventing a short circuit between the electrodes are formed.

As mentioned above, in this example, the first to fourth via holes are formed respectively in different positions in the perpendicular direction to the driving shaft, thus there are few uneven parts due to forming of the via holes, so that there are advantages that stage discontinuation at the time of connection can be prevented easily and the strength of the whole actuator is improved.

The end faces of the first and second lower electrodes 75 and 80 and of the movable electrode 86 of the variable capacitor, similarly to the first example, to prevent the second piezoelectric film 76, which is a right above layer, from cracking, is taper-etched at an angle of 25° with the substrate, and similarly the end faces of the first and second intermediate electrodes 73 and 79, to prevent the first piezoelectric film 74, which is a right above layer, from cracking, is taper-etched at an angle of 25° with the substrate.

The driving electrodes of the actuator and the electrodes of the variable capacitor are all made of Al and in this example, they are all set to 50 nm in thickness. Further, the piezoelectric films of the actuator are all made of AlN orientated in the c-axis and are all set to 400 nm in thickness. The equivalent area of the variable capacitor is set to 6400 $\mu m^2$, and the dielectric film 87 is made of AlN, and the thickness is set to 10 nm.

When a control voltage ($V_{tune}$) of 0 to 3 V is applied between the first intermediate electrode and the first upper and lower electrodes and the variable capacitor capacity between the movable electrode 86 and the fixed electrode 88 is measured, a very large variable width from a minimum of 0.31 pF to a maximum of 6.8 pF, that is, 21 times can be obtained continuously.

Next, as the seventh example of the present invention, a thin film piezoelectric actuator having a cantilever beam structure, a symmetrical bimorph structure, and moreover an air vent will be explained.

Figure 34:
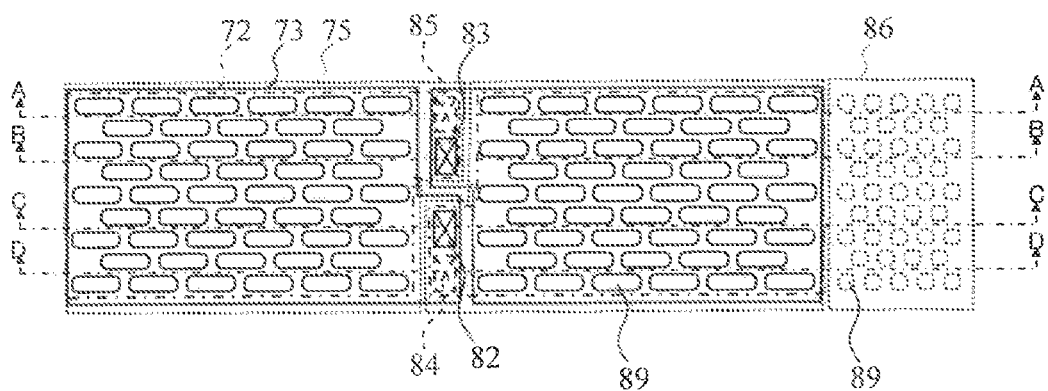
FIG. 34 is a plan view of the thin film piezoelectric actuator of a cantilever beam structure of the seventh example of the present invention.

FIG. 34 is a plan view of the thin film piezoelectric actuator of a cantilever beam structure of this example.

Figure 35:
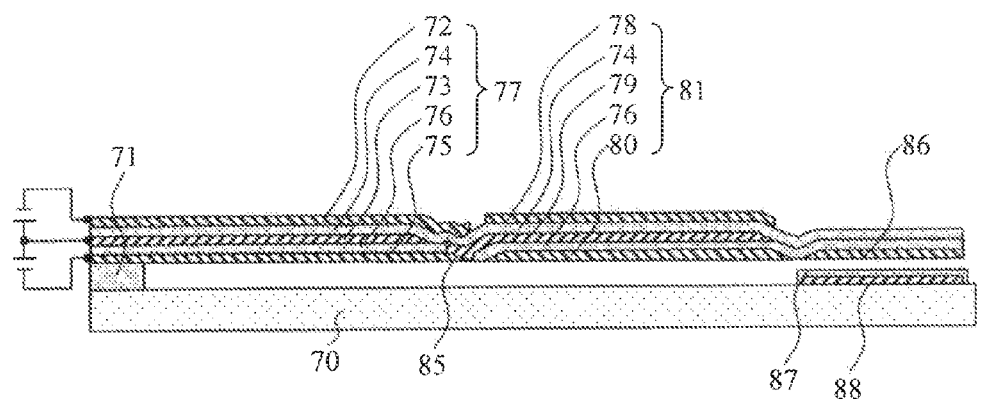
FIG. 35 is a schematic view showing the section A-A shown in FIG. 34.

Further, FIG. 35 is a schematic view showing the section A-A shown in FIG. 29.

Figure 36:
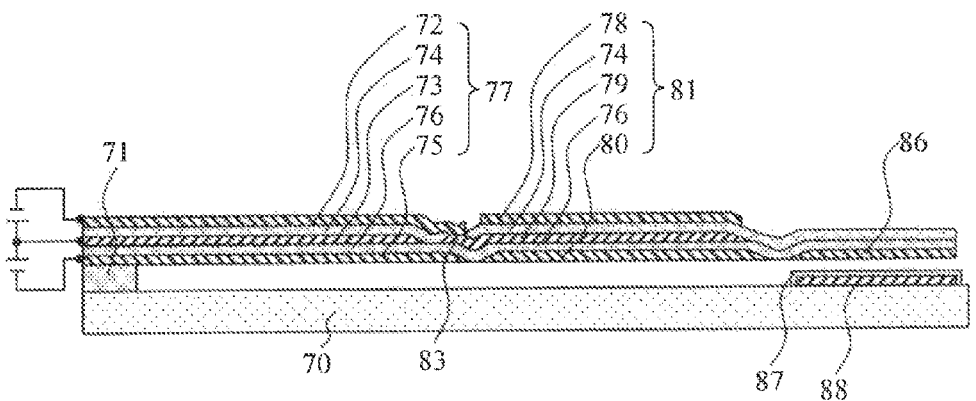
FIG. 36 is a schematic view showing the section B-B shown in FIG. 34.

Further, FIG. 36 is a schematic view showing the section B-B shown in FIG. 29.

Figure 37:
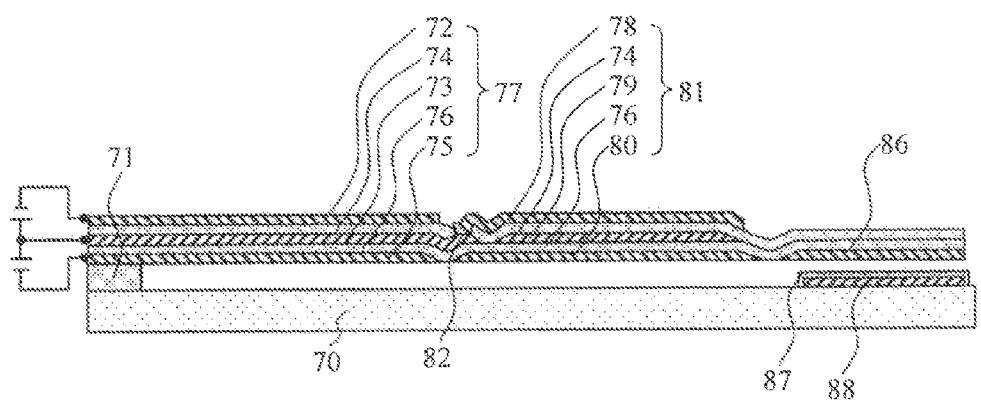
FIG. 37 is a schematic view showing the section C-C shown in FIG. 34.

Further, FIG. 37 is a schematic view showing the section C-C shown in FIG. 29.

Figure 38:
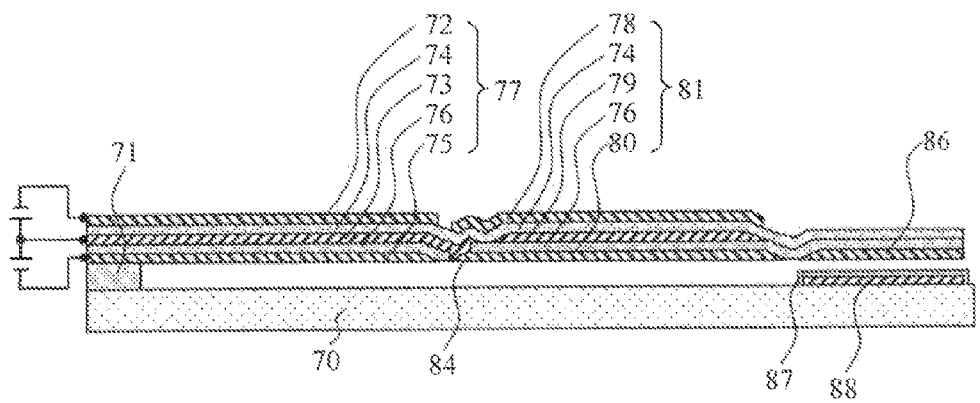
FIG. 38 is a schematic view showing the section D-D shown in FIG. 34.

Furthermore, FIG. 38 is a schematic view showing the section D-D shown in FIG. 29.

Further, in the plan view shown in FIG. 34, to avoid complication, only the upper, intermediate, and lower electrodes are shown. Further, in these drawings, to the same elements as those described in FIGS. 29 to 33, the same numerals are assigned and the detailed explanation will be omitted.

Namely, in this example, as shown in FIGS. 34 to 38, from the anchor 71 provided at one end of the substrate 70, the first driving part 77 and the second driving part 81 are provided. Excluding a respect of the cantilever beam structure, the lamination structure thereof is the same as that described in FIGS. 29 to 33.

Also in this example, the first to fourth via holes 82, 83, 84, and 85 are formed respectively in different positions in the perpendicular direction to the driving shaft, thus there are few uneven parts due to forming of the via holes, so that there are advantages that stage discontinuation at the time of connection can be prevented easily and the strength of the whole actuator is improved.

And, the end faces of the first and second lower electrodes 75 and 80 and of the movable electrode 86 of the variable capacitor, similarly to the first example, to prevent the second piezoelectric film 76, which is a right above layer, from cracking, is taper-etched at an angle of up to 30° with the substrate, and similarly the end faces of the first and second intermediate electrodes 73 and 79, to prevent the first piezoelectric film 74, which is a right above layer, from cracking, is taper-etched at an angle of 25° with the substrate. By these taper-etching processes, the piezoelectric films 76 and 74 are prevented from cracking and can perform a stable operation.

Furthermore, in this example, in the first and second driving parts 77 and 81 and the movable electrode 86, a plurality of through holes 89 are formed. These through holes 89, in the first and second driving parts 77 and 81, are formed from the upper electrodes 72 and 78 through the lower electrodes 75 and 80. Further, similarly, the through holes 89 are formed from the piezoelectric film 74 through the movable electrode 86.

Since these through holes 89 are formed, the air resistance for the movement of the actuator can be reduced greatly and the actuator can perform a smooth high-speed operation. Namely, the operation frequency of the actuator or the switching frequency can be increased and the application range can be enlarged greatly.

Concretely, according to the results of trial manufacture of the inventors, the operation speed of the thin film piezoelectric actuator is 13 micro seconds, while the operation speed when the through holes 89 are not provided is 38 micro seconds. As mentioned above, according to this example, since the through holes as an air vent are provided, the operation speed can be increased greatly.

As explained above, the present invention can provide a piezoelectric thin film actuator that the structure is stable, and the manufacturing yield is high, and the control can be executed easily, and the driving range is wide, and the driving voltage is wide. By use of the thin film piezoelectric actuator of the present invention, a microswitch driven at a low voltage and a variable capacitor having a wide variable range can be realized.

The thin film piezoelectric actuator of the examples 2 to 7 mentioned above is explained using an example of a variable capacitor as an application device thereof. However, also to the capacitive microswitch shown in the example 1, it can be applied of course.

Further, a variable capacitor to which the thin film piezoelectric actuator of the present invention is applied, when used for frequency adjustment of a voltage control oscillator (VCO) such as a portable device, can produce a greatest effect.

Figure 39:
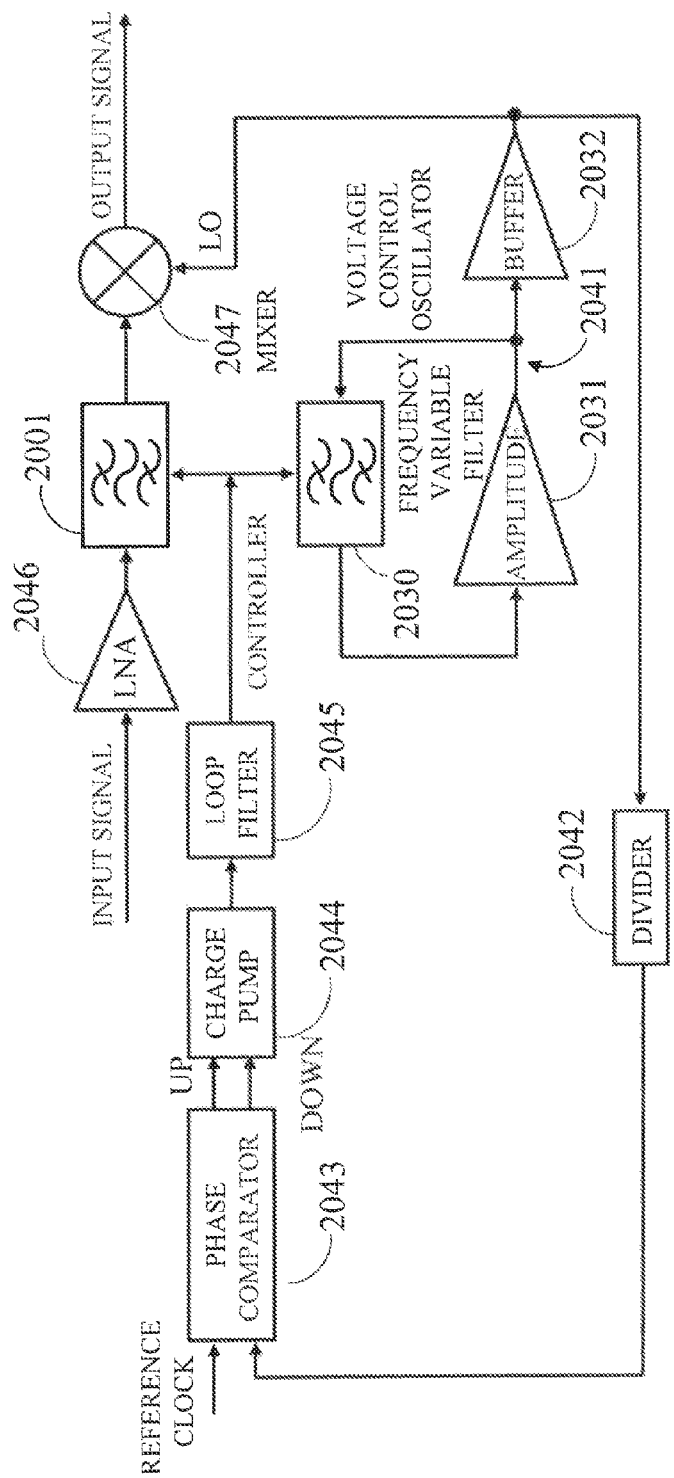
FIG. 39 is a block diagram showing an example of a phase locked loop (PLL) circuit for generating the reference frequency of a frequency synthesizer used in a portable telephone system.

FIG. 39 is a block diagram showing an example of a phase locked loop (PLL) circuit for generating the reference frequency of a frequency synthesizer used in a portable telephone system.

The PLL circuit shown in the drawing has a frequency variable filter 2030, a voltage control oscillator 2041 composed of an amplifier 2031 and a buffer amplifier 2032, a divider 2042, a phase comparator 2043, a charge pump 2044, a loop filter 2045, a low noise amplifier (LNA) 2046, a frequency variable filter 2001, and a mixer 2047.

Figure 40:
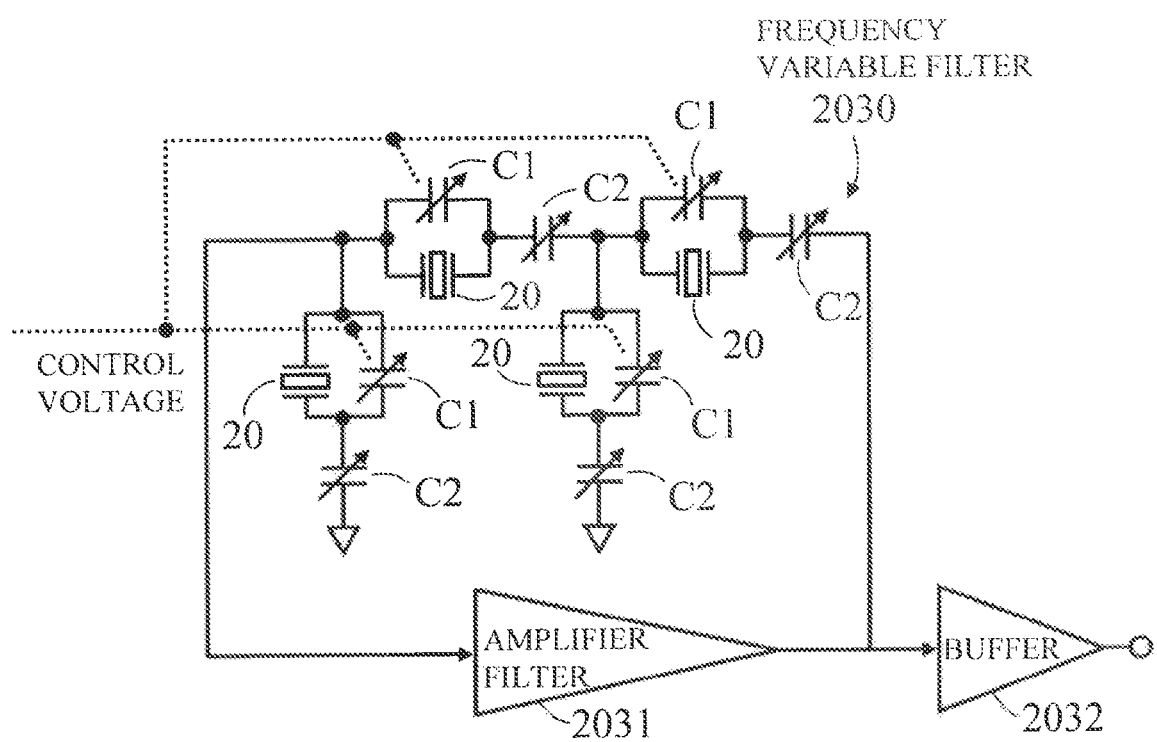
FIG. 40 is a schematic view showing an example of the internal circuit configuration of the voltage control oscillator 2041.

FIG. 40 is a schematic view showing an example of the internal circuit configuration of the voltage control oscillator 2041.

As shown in the drawing, the voltage control oscillator has the frequency variable filter 2030, the amplifier 2031, and the buffer amplifier 2031 and feeds back only the frequency component passing the frequency variable filter 2030 to the input terminal of the amplifier 2031. In the voltage control oscillator 2041, the thin film piezoelectric actuator 20 relating to the embodiments of the present invention and the capacity variable capacitors C1 and C2 are used.

The PLL circuit shown in FIG. 39, when the oscillated frequency of the voltage control oscillator 2041 is extremely higher than a desired frequency or when it is extremely lower, detects the frequency difference, converts it to a DC control voltage, and feeds back it to the variable capacity element C1 in the frequency variable filter 2001 constituting the voltage control oscillator 2041. Therefore, when the feedback loop operates normally and reaches a stable state and the phase is locked, the oscillated frequency of the voltage control oscillator 2041 can conform to a desired frequency.

The PLL circuit shown in FIG. 39 uses the frequency variable filter 2001, which is the same as the frequency variable filter 2030 constituting the voltage control oscillator 2041, as a passing band filter for communication signal filtering. The PLL circuit inputs an output signal of the low noise amplifier 2046 to the frequency variable filter 2001 and an output signal of the frequency variable filter 2001 is inputted to the mixer 2047 for down conversion.

On the other hand, the reference signal generated by the voltage control oscillator 2041 is inputted to another input terminal of the mixer 2047 as a local oscillated signal (LO). By doing this, the high-frequency signal is frequency-converted to a base band signal.

According to this concrete example, to the frequency variable filter 2001 and the frequency variable filter 2030 in the voltage control oscillator, the same control voltage generated by the loop filter 2010 is applied. By doing this, the oscillated frequency of the voltage control oscillator 2041 can form to the center frequency of the passing band of the frequency variable filter 2001.

Figure 41:
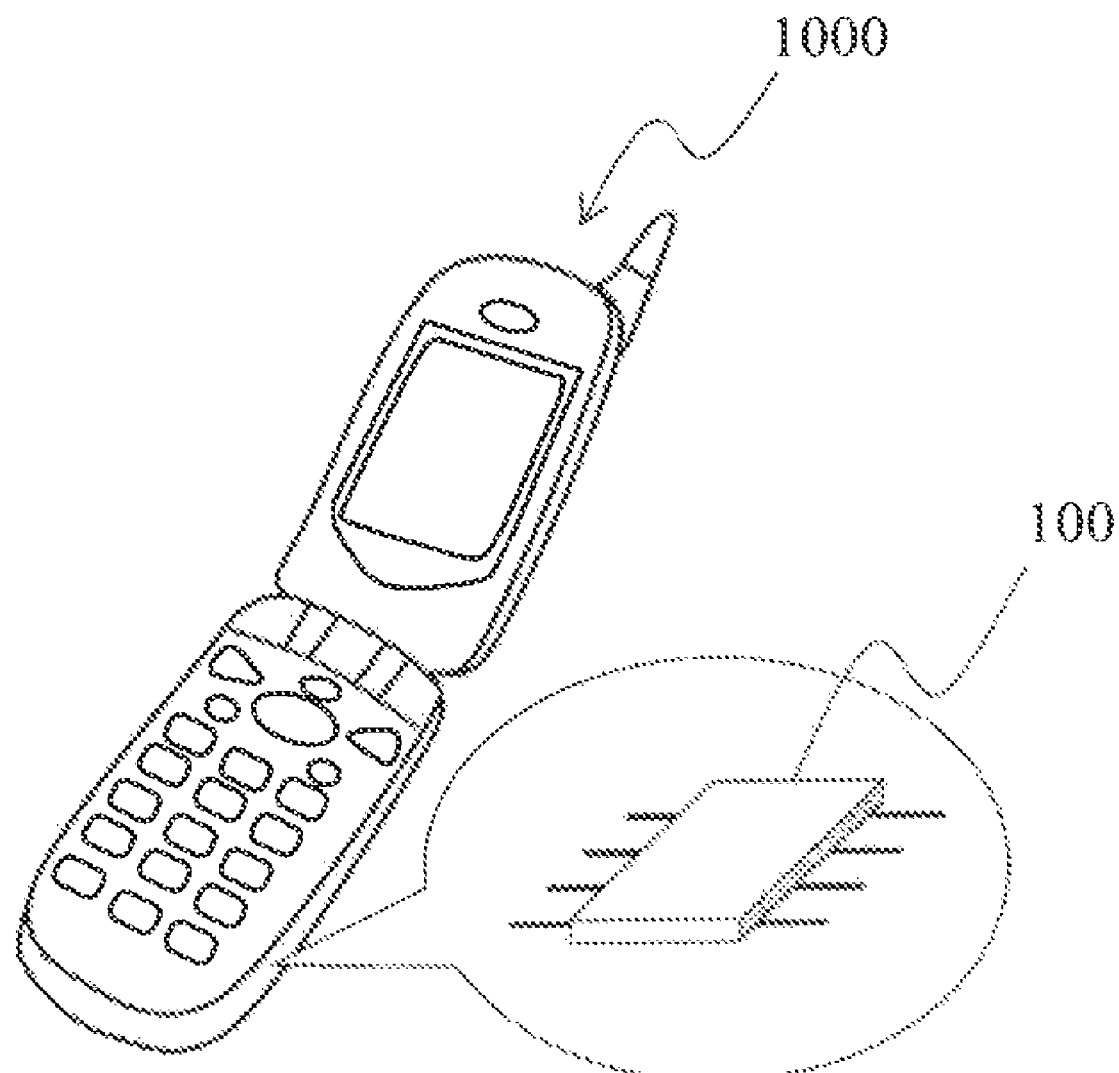
FIG. 41 is an image drawing of a portable telephone using the variable capacitor of the present invention.
Figure 42:
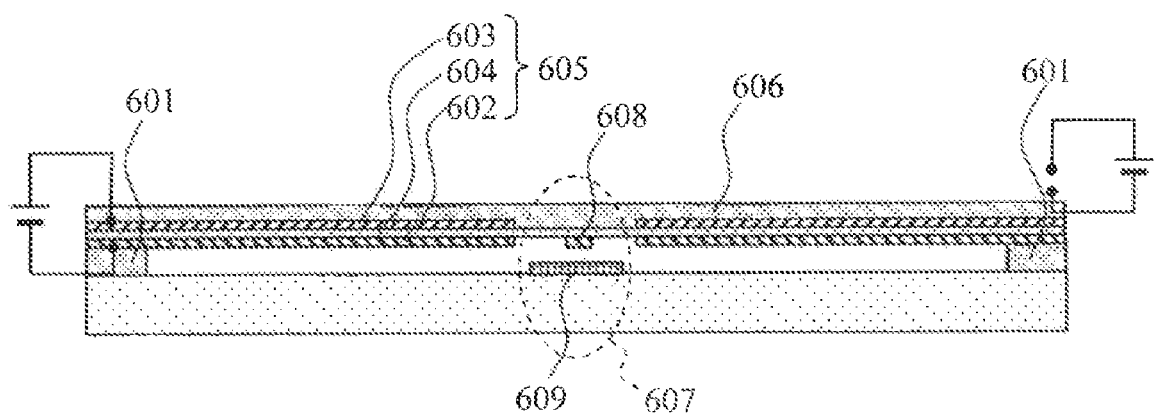
FIG. 42 is a cross sectional view of the thin film piezoelectric actuator examined by the inventors in the process to the present invention.
Figure 43:
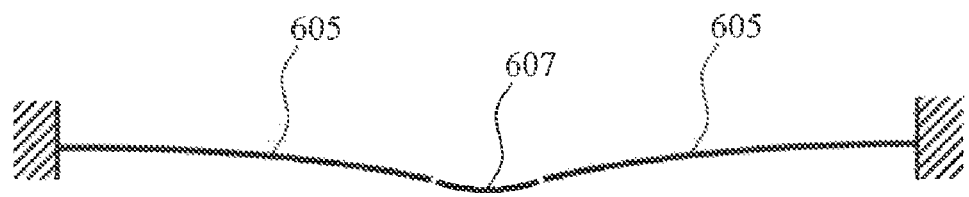
FIG. 43 is a drawing showing the operation status of the thin film piezoelectric actuator shown in FIG. 42.

The PLL circuit explained above is, for example, suitable for loading in a portable telephone 1000 illustrated in FIG. 41. Namely, when a variable capacitor 100 to which the thin film piezoelectric actuator of the present invention is applied is used for frequency adjustment of a voltage control oscillator (VCO) of the portable telephone 1000, a greatest effect can be obtained.

According to the present invention, the structures of the piezoelectric films and electrodes and connection parts can be patterned at the same time, so that excessive processing steps for connection are not required. Further, in each driving part, the driving area in which the upper and lower electrodes are opposite to each other across the piezoelectric film can be formed symmetrically vertically and horizontally with respect to the driving shaft such as a rectangle, so that it is not twisted. The thin film piezoelectric actuator of the present invention has a stable structure, a good control property, and a wide movement range. When this thin film piezoelectric actuator is applied to a device, a variable capacitor having a wide capacity variable range and a microswitch having good switching characteristics can be provided.

The embodiments of the present invention are explained above by illustrating the concrete examples. However, the present invention is not limited to these concrete examples.

For example, the characteristics of the respective thin film piezoelectric actuators described above as the first to seventh examples can be combined mutually and thin film piezoelectric actuators obtained in this way are included in the scope of the present invention. Concretely, for example, as described above regarding the fifth to seventh examples, the characteristic that the end of the lower layer of the piezoelectric film is tapered is executed similarly in the first to fourth examples and the similar operation results can be obtained. Further, the through holes 89 for air ventilation described above regarding the seventh example are provided similarly in the first to sixth examples and the similar operation results can be obtained.

Further, the concrete materials of the driving electrode, piezoelectric film, support film, capacitor electrode, and dielectric film used in the present invention are not limited to the aforementioned concrete examples and units substituted for materials having the same operations are included in the scope of the present invention.

What is claimed is:

1. A thin film piezoelectric actuator comprising a driving part at least one end of which is supported by an anchor portion, the driving part including:
   a lower electrode;
   a first piezoelectric film which is laminated directly on one side of the lower electrode and extends beyond an end face of the lower electrode;
   an upper electrode provided directly on at least one part of an opposing side of the first piezoelectric film; and
   a first via hole formed in said first piezoelectric film, said lower electrode being connected to said upper electrode through said first via hole.

2. A thin film piezoelectric actuator according to claim 1, wherein a full width at half maximum of a (0001) peak of an X-ray rocking curve of the first piezoelectric film is not larger than 5 degrees.

3. A thin film piezoelectric actuator according to claim 1, wherein the driving part is formed in a substantially round shape.

4. A thin film piezoelectric actuator according to claim 1, wherein the lower electrode and the upper electrode have a main platinum (Pt), copper (Cu), indium (Ir), tungsten (W), and molybdenum (Mo).

5. A thin film piezoelectric actuator according to claim 1, wherein the first piezoelectric film is made of aluminum nitride (AlN) or zinc oxide (ZnO) which is orientated in a c-axis.

6. A thin film piezoelectric actuator according to claim 1, wherein the end face of the lower electrode is formed in a tapered shape at up to 60° with a main surface of the lower electrode.

7. A thin film piezoelectric actuator according to claim 1, wherein the end face of the lower electrode is formed in a tapered shape at up to 30° with a main surface of the lower electrode.

8. A thin film piezoelectric actuator according to claim 1, wherein the end face of the lower electrode is formed in a tapered shape at up to 25° with a main surface of the lower electrode.

9. A thin film piezoelectric actuator according to claim 1, wherein a part of said upper electrode is formed in direct contact with said lower electrode in said first via hole.

10. A thin film piezoelectric actuator according to claim 1, comprising:
    a second piezoelectric film formed directly on said upper electrode;
    a third electrode formed directly on said second piezoelectric film;
    a second via hole formed in said second piezoelectric film; and
    said upper electrode connected to said third electrode through said second via hole.

* * * * *